United States Patent
Petrie

(10) Patent No.: US 9,062,990 B2
(45) Date of Patent: Jun. 23, 2015

(54) CIRCULAR VERTICAL HALL MAGNETIC FIELD SENSING ELEMENT AND METHOD WITH A PLURALITY OF CONTINUOUS OUTPUT SIGNALS

(75) Inventor: Craig S. Petrie, Merrimack, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 875 days.

(21) Appl. No.: 13/035,243

(22) Filed: Feb. 25, 2011

(65) Prior Publication Data
US 2012/0217955 A1 Aug. 30, 2012

(51) Int. Cl.
*G01R 33/07* (2006.01)
*G01D 5/14* (2006.01)

(52) U.S. Cl.
CPC ............ *G01D 5/145* (2013.01); *G01R 33/07* (2013.01); *G01R 33/077* (2013.01)

(58) Field of Classification Search
CPC ........................................ G01R 33/07
USPC ........................................ 324/251
See application file for complete search history.

(56) References Cited

U.S. PATENT DOCUMENTS

| 4,668,914 A | 5/1987 | Kersten et al. |
| 4,761,569 A | 8/1988 | Higgs |
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |
| 6,091,239 A | 7/2000 | Vig et al. |
| 6,100,680 A | 8/2000 | Vig et al. |
| 6,166,535 A | 12/2000 | Irle et al. |
| 6,232,768 B1 | 5/2001 | Moody et al. |
| 6,236,199 B1 | 5/2001 | Irle et al. |
| 6,265,864 B1 | 7/2001 | De Winter et al. |
| 6,288,533 B1 | 9/2001 | Haeberli et al. |
| 6,297,627 B1 | 10/2001 | Towne et al. |

(Continued)

FOREIGN PATENT DOCUMENTS

| DE | 10 2005 014 509 B4 | 10/2006 |
| DE | 10 2006 037 226 | 2/2008 |

(Continued)

OTHER PUBLICATIONS

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

(Continued)

*Primary Examiner* — Bot Ledynh
(74) *Attorney, Agent, or Firm* — Daly, Crowley, Mofford & Durkee, LLP

(57) ABSTRACT

A circular vertical Hall (CVH) sensing element and an associated method provide a plurality of output signals from a respective plurality of vertical Hall elements in the CVH sensing element at the same time.

12 Claims, 12 Drawing Sheets

(56) References Cited

U.S. PATENT DOCUMENTS

| | | | |
|---|---|---|---|
| 6,356,741 | B1 | 3/2002 | Bilotti et al. |
| 6,525,531 | B2 | 2/2003 | Forrest et al. |
| 6,542,068 | B1 | 4/2003 | Drapp et al. |
| 6,545,462 | B2 | 4/2003 | Schott et al. |
| 6,622,012 | B2 | 9/2003 | Bilotti et al. |
| 6,768,301 | B1 | 7/2004 | Hohe et al. |
| 6,969,988 | B2 | 11/2005 | Kakuta et al. |
| 7,030,606 | B2 | 4/2006 | Kato et al. |
| 7,038,448 | B2 | 5/2006 | Schott et al. |
| 7,085,119 | B2 | 8/2006 | Bilotti et al. |
| 7,119,538 | B2 | 10/2006 | Blossfeld |
| 7,159,556 | B2 | 1/2007 | Yoshihara |
| 7,235,968 | B2 | 6/2007 | Popovic et al. |
| 7,259,556 | B2 | 8/2007 | Popovic et al. |
| 7,307,824 | B2 | 12/2007 | Bilotti et al. |
| 7,362,094 | B2 | 4/2008 | Voisine et al. |
| 7,714,570 | B2 | 5/2010 | Thomas et al. |
| 7,746,065 | B2 | 6/2010 | Pastre et al. |
| 7,759,929 | B2 | 7/2010 | Forsyth |
| 7,797,604 | B2 | 9/2010 | Lee et al. |
| 7,872,322 | B2 | 1/2011 | Schott et al. |
| 7,911,203 | B2 | 3/2011 | Thomas et al. |
| 7,965,076 | B2 | 6/2011 | Schott |
| 7,994,774 | B2 | 8/2011 | Thomas et al. |
| 2002/0114269 | A1 | 8/2002 | Onggosanusi et al. |
| 2006/0011999 | A1 | 1/2006 | Schott et al. |
| 2007/0029998 | A1 | 2/2007 | Popovic et al. |
| 2007/0105244 | A1 | 5/2007 | Okita |
| 2009/0121707 | A1 | 5/2009 | Schott |
| 2009/0174395 | A1 | 7/2009 | Thomas et al. |
| 2010/0156397 | A1 | 6/2010 | Yabusaki et al. |
| 2010/0164491 | A1 | 7/2010 | Kejik et al. |
| 2011/0248708 | A1 | 10/2011 | Thomas et al. |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 10/2008 |
| EP | 2 000 814 A2 | 12/2008 |
| EP | 2 000 814 A3 | 12/2008 |
| JP | 58-055688 A | 4/1983 |
| JP | 2003-042709 | 2/2003 |
| JP | 2005241269 | 9/2005 |
| JP | 2010-014607 | 4/2008 |
| JP | 2010-078366 | 8/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 03/036733 A2 | 5/2003 |
| WO | WO 03/036733 A3 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008/145662 A1 | 12/2008 |
| WO | WO 2009/124969 A1 | 10/2009 |

OTHER PUBLICATIONS

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.

Allegro Microsystems, Inc.; "27701-An Data Sheet: Hall-Effect IC Applications Guide;" Application Information, Rev. 2; http://www.allepromicro.com/en/products/desion/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.orp/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; Allegro Microsystems, Inc.; "AN296061 Data Sheet: Ring Magnet Speed Sensing for Electronic Power Steering;" published Jul. 21, 2009; pp. 1-4.

Freitas et al.; "Giant magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with on Chip Read-Out Circuit;" The $8^{th}$ International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" Sensor + Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The $8^{th}$ International Conference on Solid-State Sensors and Acutators, Physical vol. 53, Issues 1-3; May 1996; pp. 278-283.

(56) References Cited

OTHER PUBLICATIONS

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

Sensima technology sa; "CVHD: a new concept of Angular Position Sensor;" Slide Presentation for Allegro Microsystems; Mar. 2009; 17 sheets.

Sentron; An-101; "Angular position sensing with 2-Axis Hall IC 2SA-10;" Feb. 12, 2004; http://www.diegm.uniud.it/petrella/Azionamenti%20Elettrici%20II/Sensori%20e/%20trasduttori/Data/%20Sheet%20-%202SA-10.pdf; pp. 1-7.

van der Meer; et al; "CMOS quad spinning-current Hall-sensor system for compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Voider; "The CORDIC Trigonometric Computing Technique;" The Institute of Radio Engineers, Inc.; IRE Transactions on Electronic Computers, vol. EC, Issue 3; Sep. 1959; pp. 226-230.

Drljaca, et al.; "Nonlinear Effects in Magnetic Angular Position Sensor With Integrated Flux Concentrator;" Proc. 23$^{rd}$ International Conference on Microelectronics (MIEL 2002); vol. 1; NIS; Yugoslavia; May 12-15, 2002; pp. 223-226.

Banjevic; "High Bandwidth CMOS Magnetic Sensors Based on the Miniaturized Circular Vertical Hall Device;" Sep. 2011; 153 pages.

PCT Search Report and Written Opinion of the ISA; dated Jul. 2, 2012; for PCT Pat. App. No. PCT/US2012/024424; 14 pages.

PCT International Preliminary Report on Patentability and Written Opinion of the ISA; dated Sep. 6, 2013; for PCT Pat. App. No. PCT/US2012/024424; 11 pages.

Banjevic; "High Bandwidth CMOS Magnetic Sensors Based on the Miniturized Circular Vertical Hall Device;" Ecole Polytechnique Federale DeLausanne; These N 5114; Jan. 2011; 153 pages.

Reymond et al.; "Circular Hall Transducer for Angular Position Sensing;" Sensors Conference; Mar. 2007; pp. 2593-2596.

Schurig et al.; "CMOS Integrated Vertical Hall Sensor with Low Offset;" 16$^{th}$ European Conference on Solid-State Transducers; Sep. 15-18, 2002; pp. 868-871.

U.S. Appl. No. 14/155,047, filed Jan. 14, 2014, Romero.

Kaufmann et al.; "Novel Coupling Concept for Five-Contact Vertical Hall Devices;" 16th International Solied-State Sensors, Actuators and Microsystems (Transducers) Conference; Jun. 5-9, 2011; 4 sheets.

PCT International Preliminary Report on Patentability and Written Opinion of the ISA dated Apr. 10, 2014; for PCT Pat. App. No. PCT/US2012/052639; 19 pages.

Allegro Microsystems, Inc., "High Precision Linear Hall Effect Sensor IC with a Push/Pull, Pulse Width Modulated Output", A1351 pp. 1-23.

Allegro Microsystems, Inc., "High Precision 2-Wire Linear Hall Effect Sensor IC with a Pulse Width Modulated Output", A1354, pp. 1-22.

Allegro Microsystems, Inc., "High Precision Linear Hall-Effect Sensor with an Open Drain Pulse Width Modulated Output", A1356, pp. 1-20.

Allegro Microsystems, Inc., "Low-Noise Programmable Linear Hall Effect Sensor IC's with Adjustable Bandwidth (50 kHz Maximum) and Analog Output", A1360, A1361 and A1362, pp. 1-25.

Baschirotto, A., "Development and Analysis of a PCB Vector 2-D Magnetic Field Sensor System for Electronic Compasses", IEEE Sensors Journal, vol. 6, No. 2, Apr. 2006, pp. 365-371.

Kejik, P. et al., "Purley CMOS Angular Position Sensor Based on a New Hall Microchip", 34$^{th}$ Annual Conference of IEEE Industrial Electronics, IECON2008, 2008, pp. 1777-1781.

Kejik, P.et al., "Ultra Low-Power Angular Position Sensor for High-Speed Portable Applications", IEEE Sensors 2009 Conference, pp. 173-176.

Reymond, S. et al., "True 2D CMOS Integrated Hall Sensor", IEEE Sensors 2007 Conference, pp. 860-863.

Gerhauser, H., "Intelligente 3D-Magnetfeld Snesorik", Fraunhofer-Institut for Integrierte Schaltungen IIS, www.iis.fraunhofer.de/asic/analoq, 12 pages.

Melexis Microelectronic Integrated Systems, "Triaxis 3D-Joystick Position Sensor", Data Sheet, Mar. 2009, 43 pages.

Memsic Corporation, Letter dated Jun. 12, 2010, 2 pages.

Memsic Corporation, "Electronic Tilt Compensation", Mar. 2008, 5 pages.

Memsic Corporation, "Magnetic Sensor Calibration", Mar. 2008, 5 pages.

Memsic Corporation, "Magnetometer Soldering Methodology", Jun. 2008 2 pages.

Memsic Corporation, "Magnetometer Fundamentals", Jun. 2008, 6 pages.

Memsic Corporation, "Magnetic Sensor Placement Guidelines", Oct. 2008, 2 pages.

Memsic Corporation, "Tri-axis Magnetic Sensor, with I$^2$C Interface", Aug. 14, 2008, 9 pages.

Memsic Corporation, "Ultra Small 3-axis Magnetic Sensor, with I$^2$C Interface", Mar. 31, 2010, 8 pages.

Micronas GmbH, HAL ® 3625 Programmable Direct Angle Sensor, Product Information, Sep. 2009, 2 pages.

Melexis MLX 90324; ""Under-the-Hood" Triaxis Rotary Position feat. SENT Protocol;" 3901090324 Data Sheet; Dec. 2008; 40 pages.

Notice of Allowance dated Jun. 11, 2014 from U.S. Appl. No. 13/113,603, filed May 23, 2011.

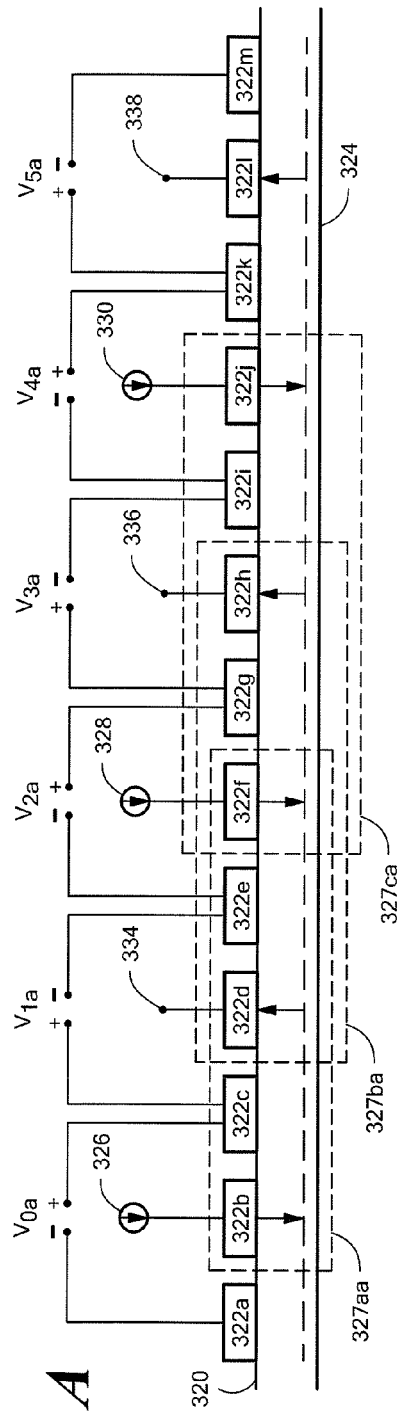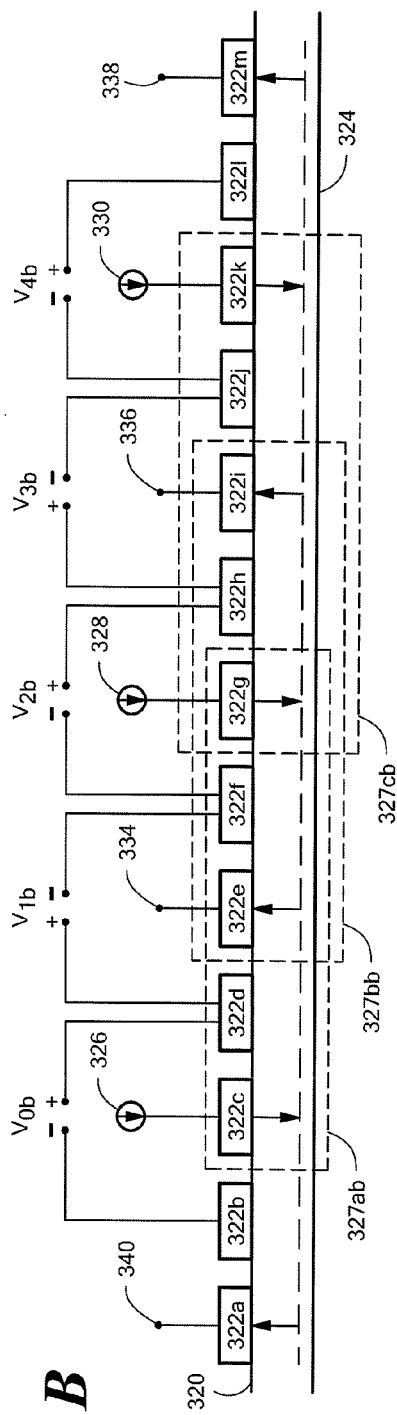
FIG. 10
FIG. 10 (Continued)

CIRCULAR VERTICAL HALL MAGNETIC FIELD SENSING ELEMENT AND METHOD WITH A PLURALITY OF CONTINUOUS OUTPUT SIGNALS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, more particularly, to a circular vertical Hall (CVH) sensing element for which output signals are generated by a plurality of vertical Hall elements at the same time.

BACKGROUND OF THE INVENTION

As is known, sensing elements are used in a variety of applications to sense characteristics of an environment. Sensing elements include, but are not limited to, pressure sensing elements, temperature sensing elements, light sensing elements, acoustic sensing elements, and magnetic field sensing elements.

Magnetic field sensing elements can be used in a variety of applications. In one application, a magnetic field sensor can be used to detect a direction of a magnetic field. In another application, a magnetic field sensing element can be used to sense an electrical current. One type of current sensor uses a Hall effect magnetic field sensing element in proximity to a current-carrying conductor.

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical magnetic field sensing elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (and optionally a strength) of a magnetic field in a plane of the substrate.

Output signals from the vertical Hall elements of a CVH sensing element are typically generated sequentially, resulting in a substantial time necessary to generate all of the output signals from the CVH sensing element.

Various parameters characterize the performance of sensing elements (and sensors that use magnetic field sensing elements) in general, and magnetic field sensing elements (and sensors) in particular. Taking a magnetic field sensing element as an example, these parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field. Other types sensing elements can also have an offset of a respective output signal that is not representative of a zero sensed characteristic when the sensing element experiences the zero sensed characteristic.

It would be desirable to provide circuits that can process sensor output signals from a plurality of sensors to provide a processed output signal having improved characteristics, including, but not limited to, an improved offset.

It would also be desirable to provide a CVH sensing element arrangement for which the output signals from the CVH sensing element are generated more quickly.

SUMMARY OF THE INVENTION

The present invention provides a circular vertical Hall (CVH) sensing element and method that can generate a plurality of output signals from the CVH sensing element at the same time. A faster CVH sensing element results.

In accordance with one aspect of the present invention, a method of operating a circular vertical Hall (CVH) sensing element having a plurality of vertical Hall element contacts disposed in a circle over a common implant region in a substrate, the method includes selecting a plurality of groups of vertical Hall element contacts from among the plurality of vertical Hall element contacts. Each group is representative of a respective one of a plurality of vertical Hall elements. The selecting comprises selecting a first group of vertical Hall element contacts representative of a first vertical Hall element, and selecting a second group of vertical Hall element contacts representative of a second vertical Hall element. The method further includes driving at the same time the first and the second vertical Hall elements to provide at the same time a first vertical Hall element output signal between two of the vertical Hall element contacts of the first group and a second vertical Hall element output signal between two of the vertical Hall element contacts of the second group. The first and the second vertical Hall element output signals are not representative of opposite magnetic field directions relative to each other.

In accordance with another aspect of the present invention, a method of operating a circular vertical Hall (CVH) sensing element having a plurality of vertical Hall element contacts disposed in a circle over a common implant region in a substrate, the method includes selecting a plurality of groups of vertical Hall element contacts from among the plurality of vertical Hall element contacts. Each group is representative of a respective one of a plurality of vertical Hall elements. The selecting comprises selecting a first group of vertical Hall element contacts representative of a first vertical Hall element, and selecting a second group of vertical Hall element contacts representative of a second vertical Hall element. The method further includes driving at the same time the first and the second vertical Hall elements to provide at the same time a first vertical Hall element output signal between two of the vertical Hall element contacts of the first group and a second vertical Hall element output signal between two of the vertical Hall element contacts of the second group. The selecting further includes selecting a third group of vertical Hall element contacts representative of a third vertical Hall element from among the plurality of vertical Hall element contacts. The driving further includes driving at the same time the third vertical Hall element to provide at the same time a third vertical Hall element output signal between two of the vertical Hall element contacts of the third group.

In accordance with another aspect of the present invention, a method of operating a circular vertical Hall (CVH) sensing element having a plurality of vertical Hall element contacts disposed in a circle over a common implant region in a substrate, the method includes selecting a plurality of groups of vertical Hall element contacts from among the plurality of vertical Hall element contacts. Each group is representative of a respective one of a plurality of vertical Hall elements. The selecting comprises selecting a first group of vertical Hall element contacts representative of a first vertical Hall element, and selecting a second group of vertical Hall element contacts representative of a second vertical Hall element. The method further includes driving at the same time the first and the second vertical Hall elements to provide at the same time a first vertical Hall element output signal between two of the vertical Hall element contacts of the first group and a second vertical Hall element output signal between two of the vertical Hall element contacts of the second group. The first and the second groups of vertical Hall element contacts share at least one vertical Hall element contact with each other.

In accordance with another aspect of the present invention, a circular vertical Hall (CVH) sensing element circuit includes a substrate, a common circular implant region in a surface of the substrate, and a plurality of vertical Hall element contacts disposed in a circle over the common implant region and upon the surface. Each group is representative of a respective one of a plurality of vertical Hall elements, a first group representative of a first vertical Hall element, and a second group representative of a second vertical Hall element. The circular vertical Hall (CVH) sensing element circuit further includes respective first and second drive signal generators disposed upon the substrate and configured to drive at the same time the first and the second vertical Hall elements to provide at the same time a first vertical Hall element output signal between two of the vertical Hall element contacts of the first group and a second vertical Hall element output signal between two of the vertical Hall element contacts of the second group. The first and the second vertical Hall element output signals are not representative of opposite magnetic field directions relative to each other.

In accordance with another aspect of the present invention, a circular vertical Hall (CVH) sensing element circuit includes a substrate, a common circular implant region in a surface of the substrate, and a plurality of vertical Hall element contacts disposed in a circle over the common implant region and upon the surface. Each group is representative of a respective one of a plurality of vertical Hall elements, a first group representative of a first vertical Hall element, and a second group representative of a second vertical Hall element. The circular vertical Hall (CVH) sensing element circuit further includes respective first and second drive signal generators disposed upon the substrate and configured to drive at the same time the first and the second vertical Hall elements to provide at the same time a first vertical Hall element output signal between two of the vertical Hall element contacts of the first group and a second vertical Hall element output signal between two of the vertical Hall element contacts of the second group. A third group selected from the plurality of vertical Hall element contacts is representative of a third vertical Hall element. The circular vertical Hall (CVH) sensing element circuit further includes a respective third drive signal generator disposed upon the substrate and configured to drive at the same time the third vertical Hall element to provide at the same time a third vertical Hall element output signal between two of the vertical Hall element contacts of the third group.

In accordance with another aspect of the present invention, a circular vertical Hall (CVH) sensing element circuit includes a substrate, a common circular implant region in a surface of the substrate, and a plurality of vertical Hall element contacts disposed in a circle over the common implant region and upon the surface. Each group is representative of a respective one of a plurality of vertical Hall elements, a first group representative of a first vertical Hall element, and a second group representative of a second vertical Hall element. The circular vertical Hall (CVH) sensing element circuit further includes respective first and second drive signal generators disposed upon the substrate and configured to drive at the same time the first and the second vertical Hall elements to provide at the same time a first vertical Hall element output signal between two of the vertical Hall element contacts of the first group and a second vertical Hall element output signal between two of the vertical Hall element contacts of the second group. The first and the second groups of vertical Hall element contacts share at least one vertical Hall element contact with each other.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
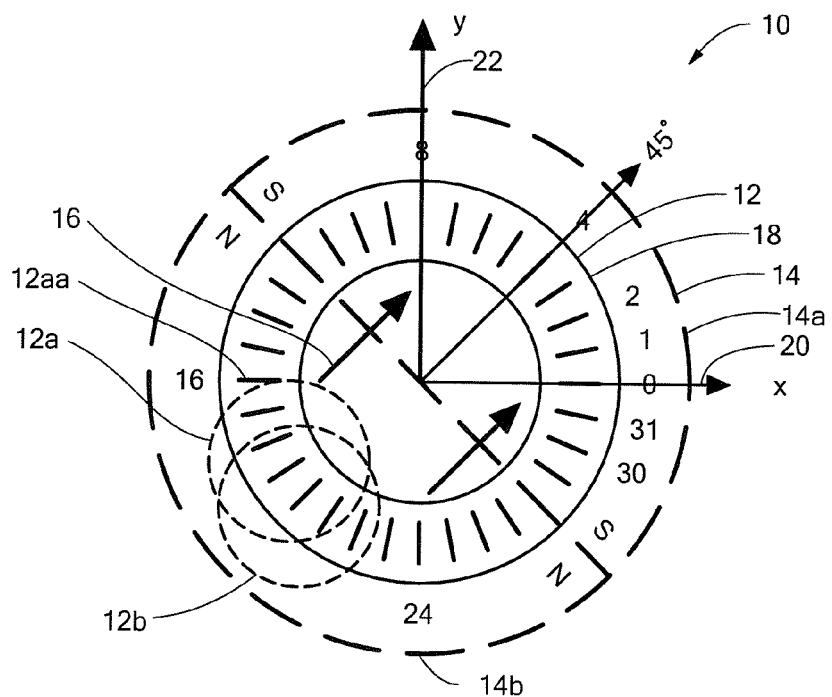
FIG. 1 is a pictorial showing a circular vertical Hall (CVH) sensing element having a plurality of vertical Hall elements arranged in a circle over a common implant region and a two pole magnet disposed close to the CVH sensing element.

Before describing the present invention, some introductory concepts and terminology are explained. As used herein, the term "sensing element" is used to describe a variety of types of electronic elements that can sense a characteristic of the environment. For example, sensing elements include, but are not limited to, pressure sensing elements, temperature sensing elements, light sensing elements, acoustic sensing elements, and magnetic field sensing elements.

As used herein, the term "sensor assembly" is used to describe a circuit or assembly that includes a sensing element and other components. In particular, as used herein, the term "magnetic field sensor assembly" is used to describe a circuit or assembly that includes a magnetic field sensing element and electronics coupled to the magnetic field sensing element.

As used herein, the term "sensor" is used to describe either a sensing element or a sensor assembly.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While a circular vertical Hall (CVH) magnetic field sensing element, which has a plurality of vertical Hall magnetic field sensing elements, is described in examples below, it should be appreciated that the same or similar techniques and circuits apply to any type of sensing elements or any type of sensor assemblies, i.e., to any type of sensors.

Referring to FIG. 1, a circular vertical Hall (CVH) sensing element 12 includes a circular implant region 18 having a plurality of vertical Hall elements disposed thereon, of which a vertical Hall element 12a is but one example. Each vertical Hall element has a plurality of Hall element contacts (e.g., four or five contacts), of which a vertical Hall element contact 12a is but one example.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14a and a south side 14b can be disposed over the CVH 12. The circular magnet 14 tends to generate a magnetic field 16 having a direction from the north side 14a to the south side 14b, here shown to be pointed to a direction of about forty-five degrees relative to x-axis 20.

In some applications, the circular magnet 14 is mechanically coupled to a rotating object, for example, an automobile steering shaft or an automobile camshaft, and is subject to rotation relative to the CVH sensing element 12. With this arrangement, the CVH sensing element 12 in combination with an electronic circuit described below can generate a signal related to the angle of rotation of the magnet 14.

Figure 1A:
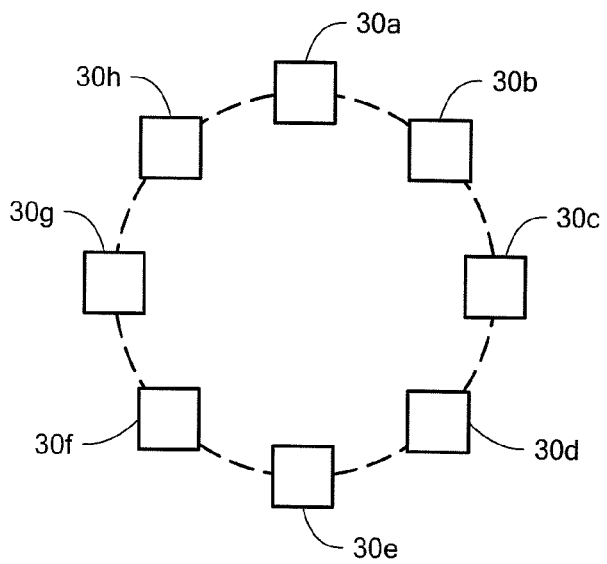
FIG. 1A is a pictorial showing a plurality of sensing elements (or alternatively, sensors), for example, Hall elements, planar or vertical.

Referring now to FIG. 1A, a plurality of sensing elements 30a-30h (or alternatively, sensors), in a general case, can be any type of sensing elements, including, but not limited to, pressure sensing elements, temperature sensing elements, light sensing elements, acoustic sensing elements, and magnetic field sensing elements. The magnetic field sensing elements 30a-30h can be, for example, planar Hall elements, vertical Hall elements, or magnetoresistance elements. These elements can also be coupled to an electronic circuit, in particular, to a combining circuit described below. For embodiments where the sensing elements 30a-30h are vertical Hall elements, there can also be a magnet the same as or similar to the magnet 14 of FIG. 1, disposed proximate to the sensing elements 30a-30h.

While the sensing elements 30a-30h are shown to be arranged in a circle, in some embodiments, the sensing elements can be arranged in another configuration, for example, in a line. Where the sensing elements 30a-30h are magnetic field sensing elements, such a linear arrangement can be used, for example, to detect a linear position of a ferromagnetic object. Where the sensing elements 30a-30h are acoustic sensors, such a linear arrangement can be used, for example, to characterize a position of a sound wave along a line.

Figure 2:
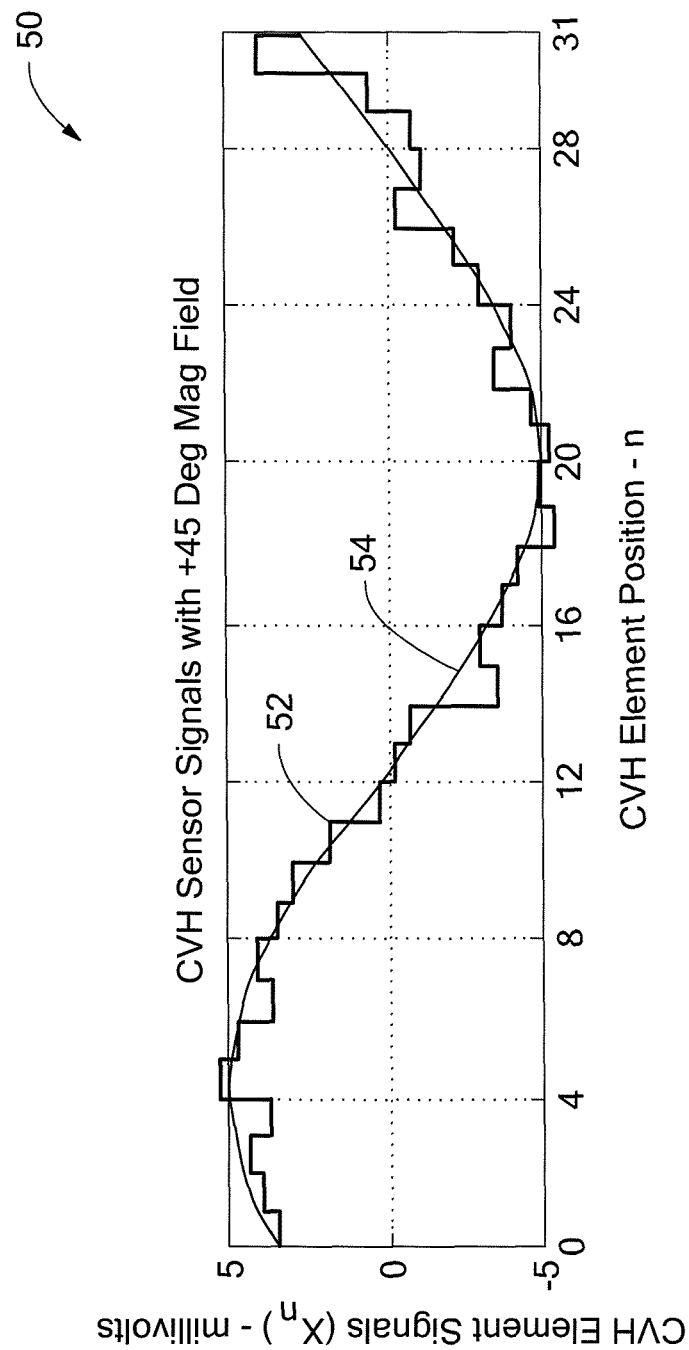
FIG. 2 is a graph showing an output signal as may be generated by the CVH sensing element of FIG. 1 or by the sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show the ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable.

Full operation of the CVH sensing element 12 of FIG. 1 and generation of the signal 52 of FIG. 2 are described in more detail in the above-described PCT Patent Application No. PCT/EP2008056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008056517, groups of contacts of each vertical Hall element can be used in a multiplexed or chopped arrangement to generate chopped output signals from each vertical Hall element. Thereafter, or in parallel (i.e., at the same time), a new group of adjacent vertical Hall element contacts can be selected (i.e., a new vertical Hall element), which can be offset by one element from the prior group. The new group can be used in the multiplexed or chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, i.e., from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008056517, a phase of the signal 52 (e.g., a phase of the signal 54) can be found and can be used to identify the pointing direction of the magnetic field 16 of FIG. 1 relative to the CVH 12.

Figure 3:
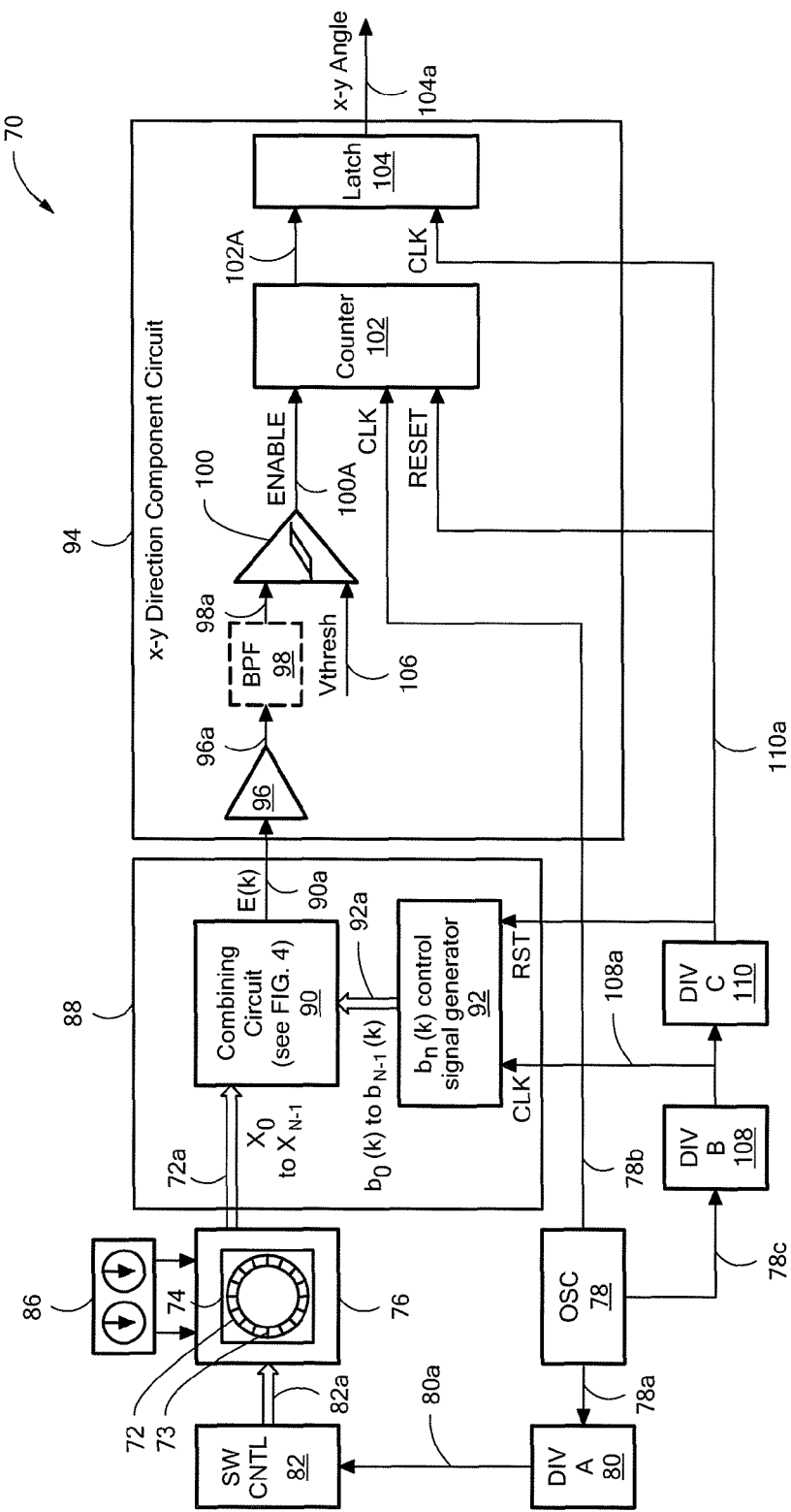
FIG. 3 is a block diagram showing a magnetic field sensor including the CVH sensing element of FIG. 1 and having a combining circuit and a $b_n$ control signal generator.

Referring now to FIG. 3, a circuit 70 includes a CVH sensing element 72 having a plurality of vertical Hall elements, each vertical Hall element comprising a group of vertical Hall element contacts (e.g., five vertical Hall element contacts), of which a vertical Hall element contact 73 is but one example.

In some embodiments, a switching circuit 74 can provide CVH output signals 72a, also referred to as CVH output signals $x_n = x_0$ to $x_{N-1}$, where n is equal to a vertical Hall element position (i.e., a position of a group of vertical Hall element contacts that form a vertical Hall element) in the CVH sensing element 72, and where there are N such positions.

In some embodiments, the CVH output signals 72a are comprised of sequential output signals taken one-at-a-time around the CVH sensing element 72, wherein each output signal is generated on a separate signal path. In other embodiments, all of the CVH output signals 72a are generated and provided continuously, wherein each one of the CVH output signals 72a is still generated on a separate signal path. In the latter embodiments, the switching circuit 74 is not required. A continuous arrangement is described more fully below in conjunction with FIG. 10.

In one particular embodiment, the number of vertical Hall elements (each comprising a group of vertical Hall element contacts) in the CVH sensing element 72 is equal to the total number of sensing element positions, N. In other words, the CVH output signals 72a can be comprised of sequential or parallel output signals, wherein each one of the CVH output signals 72a is associated with a respective one of the vertical Hall elements in the CVH sensing element 72, i.e., the circuit 10 steps around the vertical Hall elements of the CVH sensing element 72 by increments of one, and N equals the number of vertical Hall elements in the CVH sensing element 72. However, in other embodiments, the increments can be by greater than one vertical Hall element, in which case N is less than the number of vertical Hall elements in the CVH sensing element 72.

In one particular embodiment, the CVH sensing element 72 has thirty-two vertical Hall elements, i.e., N=32, and each step is a step of one vertical Hall element contact position (i.e., one vertical Hall element position). In another embodiment, the CVH sensing element 72 has thirty-two vertical Hall elements, i.e., N=32, and each step is a step of two vertical Hall element contact positions (i.e., one vertical Hall element position), which means that the CVH sensing element has sixty-four vertical Hall element contacts. In other embodiments, there can be more than thirty-two or fewer than thirty-two vertical Hall elements in the CVH sensing element 72. Also, the increments of vertical Hall element positions, n, can be greater than one vertical Hall element contact.

In general, a subscript is used herein is to represent a vertical Hall element position, whether or not the number of vertical Hall elements is the same as the number of element positions.

In some embodiments, another switching circuit 76 can provide the above-described "chopping" of groups of the vertical Hall elements within the CVH sensing element 72. Chopping will be understood to be an arrangement in which a group of vertical Hall element contacts, for example, five vertical Hall element contacts are driven with current sources 86 in a plurality of connection configurations, and signals are received from the group of vertical Hall element contacts in corresponding configurations. Thus, in accordance with each vertical Hall element position, n, there can be a plurality of output signals during the chopping, and then the group increments to a new group, for example, by an increment of one vertical Hall element contact.

The circuit 70 includes an oscillator 78 that provides clock signals 78a, 78b, 78c, which can have the same or different frequencies. A divider 80 is coupled to receive the clock signal 78a and configured to generate a clock signal 80a. A switch control circuit 82 is coupled to receive the clock signal 80a and configured to generate switch control signals 82a, which are received by the switching circuits 74, 76 to control the sequencing around the CVH sensing element 72, and, optionally, to control chopping of groups of vertical Hall elements within the CVH sensing element 72 in ways described above.

The current sources 86 are used to bias the vertical Hall elements of the CVH sensing element 72 when operating with or without chopping.

A preprocessing circuit 88 is coupled to receive the CVH output signals 72a. In particular, a combining circuit 90 is coupled to receive the CVH output signals 72a and configured to generate a preprocessed signal 90a.

The circuit 70 can include divider 108 coupled to receive the clock signal 78c and configured to generate a clock signal 108a. A divider 110 can be coupled to receive the clock signal 108a and configured to generate a clock signal 110a.

The preprocessing circuit can include a $b_n(k)$ control signal generator 92 coupled to receive the clock signal 108a at a clock input and coupled to receive the clock signal 110a at a reset input. Operation of the $b_n(k)$ control signal generator 92 is further described below in conjunction with FIGS. 5, 6, and 6A. Let it suffice here to say that the $b_n(k)$ control signal generator 92 is configured to generate control signals 92a, $b_0(k)$ to $b_{N-1}(k)$, which are a plurality of control signals to control the combining circuit 90.

The combining circuit 90 is described more fully below in conjunction with FIG. 4. Let it suffice here to say that the combining circuit 90 is configured to combine the CVH output signals 72a in ways that provide and enhanced performance of the circuit 70 that would otherwise not be available. The combining circuit 90 is configured to generate a combined signal 90a, E(k).

Referring to the control signals 92a, $b_0(k)$ to $b_{N-1}(k)$, as used herein, an index variable (k) is used to describe an indexing of the $b_n(k)$ control signals 92a. As described above, the subscript n is used to represent a vertical Hall element position. For thirty-two such vertical Hall elements (i.e., thirty-two groups of vertical Hall element contacts) in the CVH sensing element 72, there can be 32 such positions, and thus, there can be N=32 such control signals. The parameter k is used to describe a time indexing of the N control signals, such that at one time index value, the N control signals have a particular state configuration, and at another time index value, the N control signals have another particular state configuration. The $b_n(k)$ control signals 92a are described more fully below in conjunction with FIG. 5.

The circuit 70 can also include an x-y direction component circuit 94 coupled to receive the combined signal 90a and configured to generate an x-y angle signal 104a representative of an angle of a magnetic field in a plane of the CVH sensing element. For example, the x-y angle signal 104a can be a digital signal representative of an angle of the magnetic field 16 of FIG. 1 relative to the CVH sensing element 12.

The x-y direction component circuit 94 can include an amplifier 96 coupled to receive the combined signal 90a and configured to generate an amplified signal 96a. An optional band pass filter 98 can be coupled to receive the amplified signal 96a and configured to generate a filtered signal 98a.

A comparator 100 with hysteresis can be coupled to receive the filtered signal 98a and also coupled to receive a predetermined threshold signal 106 and configured to generate a two-state signal 100a. A counter 102 can be coupled to receive the two-state signal 100a at an enable input, to receive the clock signal 78b at a clock input, and to receive the clock signal 110a at a reset input.

The counter 102 is configured to generate a phase signal 102a having a count representative of a phase between the two-state signal 100a and the clock signal 110a. The phase signal is received by a latch 104 that is latched in accordance with the clock signal 110a. The latch 104 is configured to generate a latched signal 104a.

It will become apparent that the latched signal 104a is a multi-bit digital signal that has a value representative of an angle of the magnetic field experience by the CVH sensing element 72.

In some embodiments, all parts of the circuit 70 are fabricated on a single common substrate, for example, a silicon substrate.

Figure 4:
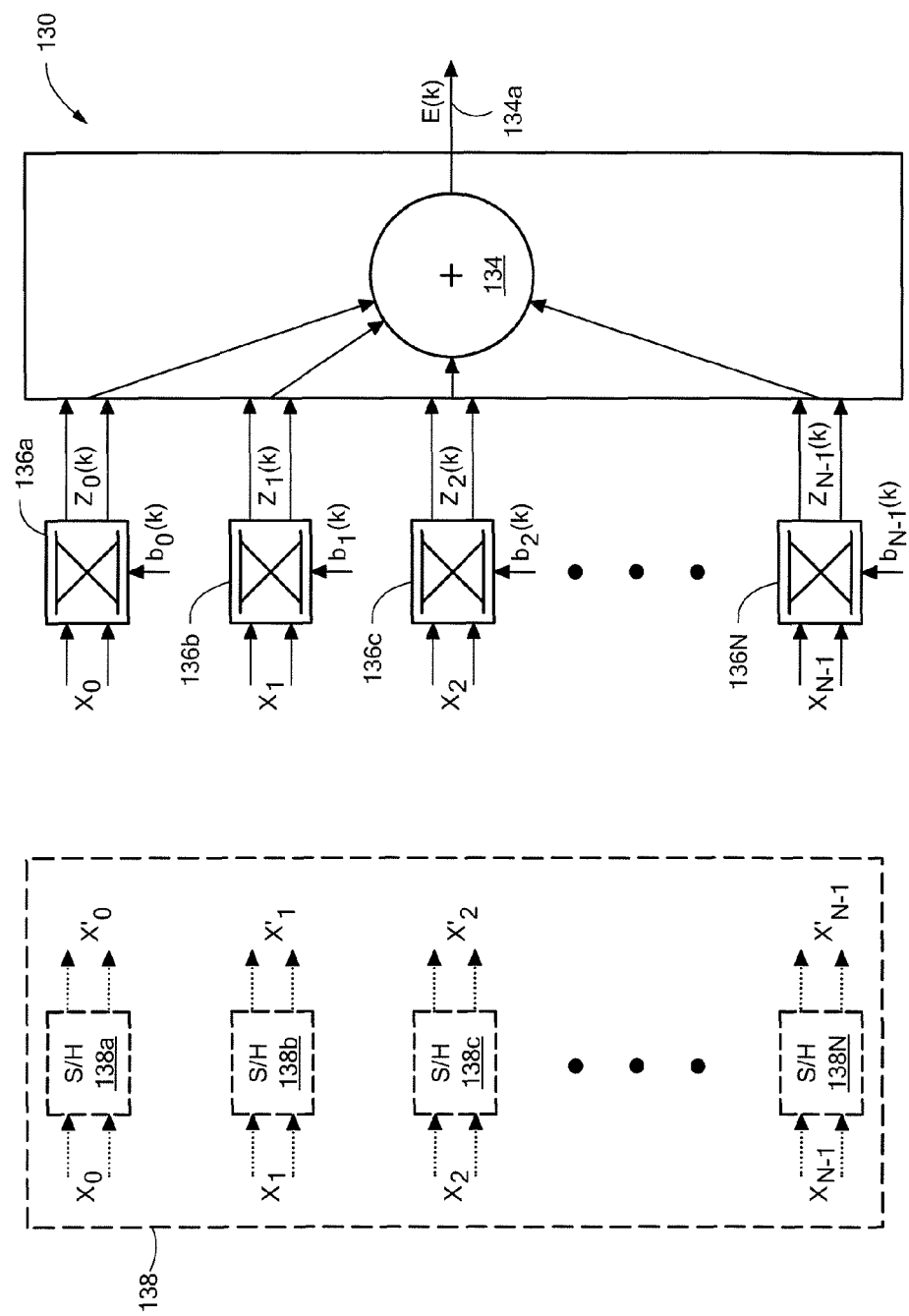
FIG. 4 is block diagram showing an exemplary combining circuit that can be used as the combining circuit of FIG. 3, which includes switching circuits and a summing circuit.

Referring now to FIG. 4, a combining circuit 130 can be the same as or similar to the combining circuit 90 of FIG. 3. The combining circuit 130 can include a plurality of switching circuits 136a-136N, each coupled to receive a respective one of the CVH output signals 72a, $x_n = x_0$ to $x_{N-1}$, of FIG. 3. The switching circuits 136a-136N are also each coupled to receive a respective one of the control signals 92a, $b_0(k)$ to $b_{N-1}(k)$, of FIG. 3.

Optionally, respective sample and hold circuits 138 can be coupled before the switching circuits 136a-136N. The sample and hold circuits 138 can be used for embodiments described above in which the CVH output signals 72a of FIG. 3 are sequentially generated. In these embodiments, sampled signals $x'_0$ to $x'_{N-1}$, sampled sequentially and held, are provided to the switching circuits 136a-136N instead of the signals $x_0$ to $x_{N-1}$.

For embodiments also described above, for which the CVH output signals 72a of FIG. 3 are continuously generated, no sample and hold circuits 138 are needed, and signals $x_0$ to $x_{N-1}$ are provided at the same time to the switching circuits 136a-136N.

The switching circuits 136a-136N generate respective switched signals $z_0(k)$ to $z_{N-1}(k)$ (e.g., 32 switched signals). A summing circuit 134 is coupled to receive the switched signals, $z_0(k)$ to $z_{N-1}(k)$, and configured to generate a combined signal 134a, which can be the same as or similar to the combined signal 90a of FIG. 3.

In operation, at any particular time, some of the control signals, $b_0(k)$ to $b_{N-1}(k)$, are in a high state and others are in a low state. The switching circuits 136a-136N are responsive to respective states of the control signals, $b_0(k)$ to $b_{N-1}(k)$, such that, in response to one particular state of a respective control signal, a respective one of the CVH output signals, $x_0$ to $x_{N-1}$, is inverted as it passes through the respective switching circuit, and in response to the other different state of the control signal, the CVH output signal is not inverted. Outputs signals, $z_0(k)$ to $z_{N-1}(k)$, result, which can be differential signals as shown, or which, in other embodiments, can be signal-ended signals.

It will be appreciated that the combined signal 134a, E(k), is essentially a sum of signals, i.e., a sum of some of the CVH output signals, $x_0$ to $x_{N-1}$, that are inverted along with some of the CVH output signals, $x_0$ to $x_{N-1}$, that are not inverted.

In operation, the control signals, $b_0(k)$ to $b_{N-1}(k)$, change state from time to time. Changes of the control signals, $b_0(k)$ to $b_{N-1}(k)$, are more fully described below in conjunction with FIGS. 5, 8, and 8A.

Figure 5:
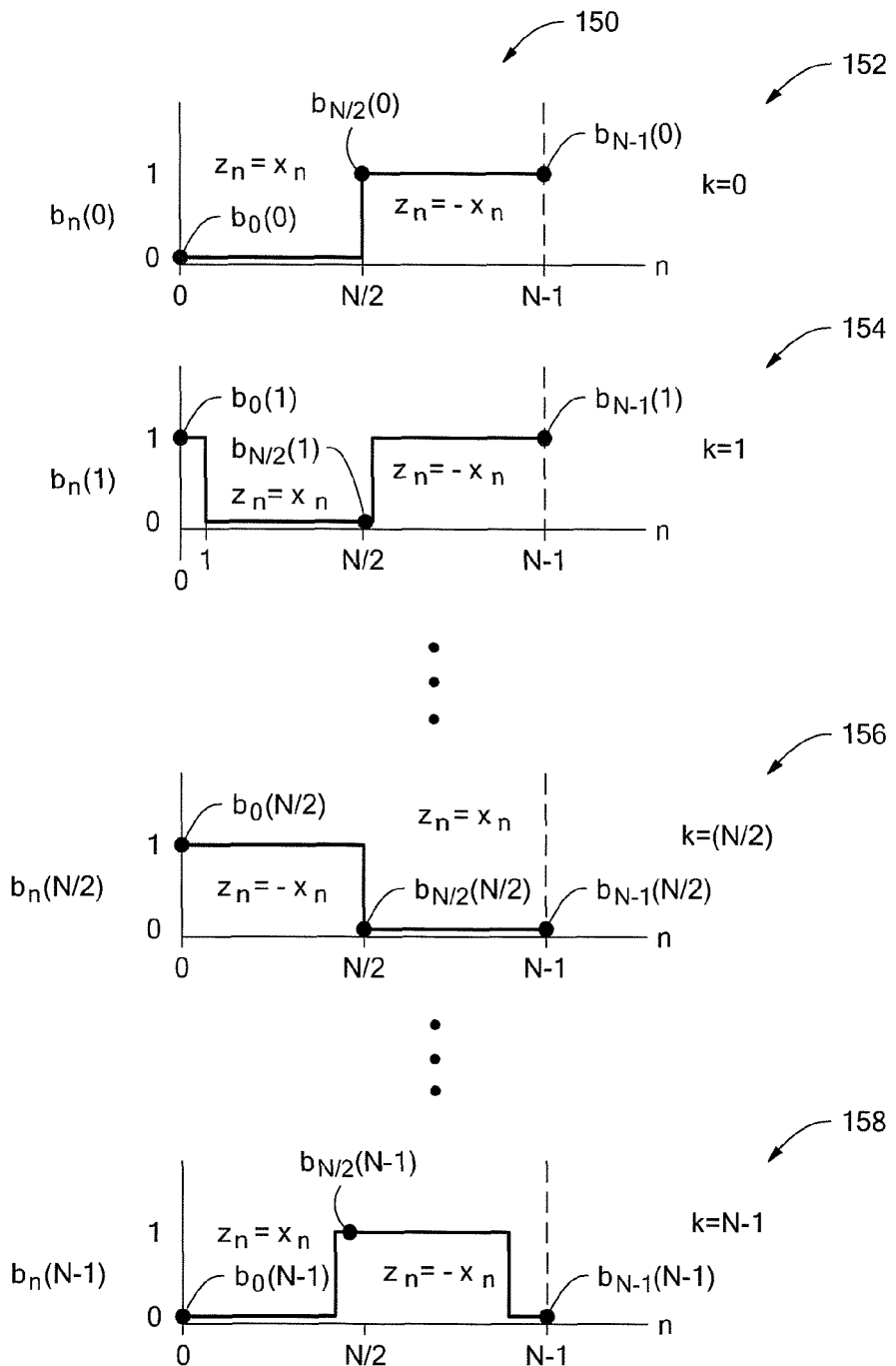
FIG. 5 is a series of graphs showing behavior of exemplary $b_n$ control signals generated by the $b_n$ control signal generator of FIG. 3.

Referring now to FIG. 5, graphs 152-158 each have a horizontal axis with a scale in units of vertical Hall element position around a CVH sensing element, and a vertical axis having a scale in units representative of a binary state (1 (e.g., high) or 0 (e.g., low)) of the $b_n$ control signals, $b_0(k)$ to $b_{N-1}(k)$ of FIG. 4 and the $b_n$ control signals 92a of FIG. 3.

As described above, the Hall element positions, N positions, represented by the horizontal axes, can have steps of one vertical Hall element (i.e., one vertical Hall element contact) or steps of more than one vertical Hall element (i.e., more that one vertical Hall element contact). Furthermore, the positions can be indicative of positions of respective groups of Hall elements when used in a chopped arrangement.

Each one of the graphs represents the control signals, $b_0(k)$ to $b_{N-1}(k)$, taken at a different time. For example, the graph 152 shows that, at a first time (or increment 0) of the indexing variable, k, the control signals from $b_0(0)$ to $b_{N/2-1}(0)$ are low and the control signals from $b_{N/2}(0)$ to $b_{N-1}(0)$ are high.

As described above, the subscript index is representative of the position, n, of the vertical Hall element (or group of vertical Hall element contacts) around the CVH sensing element, and there are N such positions from 0 to N−1. The index, k, is representative of a time increment associated with a change of the control signals, $b_0(k)$ to $b_{N-1}(k)$.

At the $0^{th}$ increment of the index, k, the control signal $b_0(0)$ is low and is the control signal received by the switching circuit 136a of FIG. 4 at a particular time represented by k=0. The low control signal, $b_0(0)$, can cause the switching circuit 136a not to invert, resulting in $z_0(0)=x_0(0)$. At the N/2 vertical Hall element position, the control signal, $b_{N/2}(0)$, is high, causing a respective one of the switching circuits of FIG. 3 to invert, resulting in $z_{N/2}(0)=-x_{N/2}(0)$. At the last vertical Hall element position, N−1, the respective control signal, $b_{N-1}(0)$, is high, also causing the switching circuit 136N of FIG. 3 to invert, resulting in $z_{N-1}(0)=-x_{N-1}(0)$.

The graphs 154-158 are representative of one particular embodiment, for which, at each increment of the time index, k, the control signals $b_0(k)$ to $b_{N-1}(k)$ shift by one vertical Hall element position (i.e., by one vertical Hall element contact). Thus, referring to the graph 154, at the $0^{th}$ increment of the index, k, the control signal $b_0(1)$ is now high and is the control signal received by the switching circuit 136a of FIG. 4. The high control signal, $b_0(1)$, can cause the switching circuit 136a to invert, resulting in $z_0(1)=-x_0(1)$. At the N/2 vertical Hall element position, the control signal, $b_{N/2}(1)$, is now low, causing a respective one of the switching circuits of FIG. 3 not to invert, resulting in $z_{N/2}(1)=x_{N/2}(1)$. At the last vertical Hall element position, N−1, the respective control signal, $b_{N-1}(1)$, is still high, causing the switching circuit 136N of FIG. 3 to invert, resulting in $z_{N-1}(1)=-x_{N-1}(1)$.

Similarly, referring to the graph 156, at the N/2 increment of the index, k, the control signal $b_0(N/2-1)$ is high and is the control signal received by the switching circuit 136a of FIG. 4. The high control signal, $b_0(N/2)$, can cause the switching circuit 136a to invert, resulting in $z_0(N/2)=-x_0(N/2)$. At the N/2 vertical Hall element position, the control signal, $b_{N/2}(N/2)$, is low, causing a respective one of the switching circuits of FIG. 3 not to invert, resulting in $z_{N/2}(N/2)=x_{N/2}(N/2)$. At the last vertical Hall element position, N−1, the respective control signal, $b_{N-1}(N/2)$, is now low, causing the switching circuit 136N of FIG. 3 not to invert, resulting in $z_{N-1}(N/2)=x_{N-1}(N/2)$.

Finally, referring to the graph 158, at the N−1 increment of the index, k, the control signal $b_0(N-1)$ is now low, causing the switching circuit 136a to not invert, resulting in $z_0(N-1)=x_0(N-1)$. At the N/2 vertical Hall element position, the control signal, $b_{N/2}(N-1)$, is now high, causing a respective one of the switching circuits of FIG. 3 to invert, resulting in $z_{N/2}(N-1)=-x_{N/2}(N-1)$. At the last vertical Hall element position, N−1, the respective control signal, $b_{N-1}(N-1)$, is low, causing the switching circuit 142 of FIG. 3 not to invert, resulting in $z_{N-1}(N-1)=x_{N-1}(N-1)$.

While half of the control signals $b_0(k)$ to $b_{N/2-1}(k)$ at any increment of the index, k, are shown to be high and the other half to be low, in other embodiments, other proportions of high and low control signals can be used. This can include proportions all the way down to one control signal being in one state and all of the other control signals being in another state. However, it will be understood from discussion below that a best signal to noise ratio is obtained when the proportion is one-half.

As used herein, the phrase "approximately half" refers to a range of about forty percent to about sixty percent.

Figure 6:
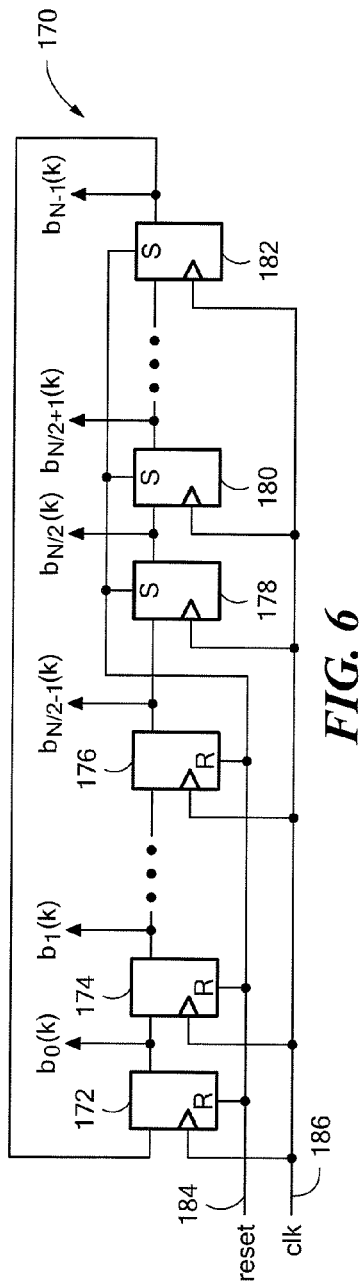
FIG. 6 is a block diagram of an exemplary $b_n$ control signal generation circuit that can be used as the $b_n$ control signal generator of FIG. 3.

Referring now to FIG. 6, a $b_n$ control signal generator 170 can be the same as or similar to the $b_n$ control signal generator 92 of FIG. 3 and can generate the $b_n$ control signals of FIG. 5, which can be the same as or similar to the $b_n$ control signals 92a of FIG. 3.

The $b_n$ control signal generator 170 can include a first plurality of flip-flops 172-176 coupled to receive a clock signal 186 at respective clock inputs. The output from a prior flip-flop is coupled to a data input of a next flip-flop. The plurality of flip-flops 172-176 is coupled to receive a reset signal 184 at respective reset inputs.

A second plurality of flip-flops 178-182 is also coupled to receive the clock signal 186 at respective clock inputs. The output from a prior flip-flop is coupled to a data input of a next flip-flop. The plurality of flip-flops 178-182 is coupled to receive the signal 184 at respective set inputs.

A last flip-flop 182 is coupled to provide its output signal to the data input of the first flip-flop 172.

With the above arrangement, the flip-flops 172-176 are set low in accordance with the reset signal 184, and the flip-flops 178-182 are set high.

The signal 186 can be the same as or similar to the clock signal 108a of FIG. 3 and the signal 184 can be the same as or similar to the clock signal 110a of FIG. 3. With each subsequent rising edge of clock signal 186, the position of the N/2 adjacent low signals and N/2 adjacent high signals are shifted one position to the right.

Figure 6A:
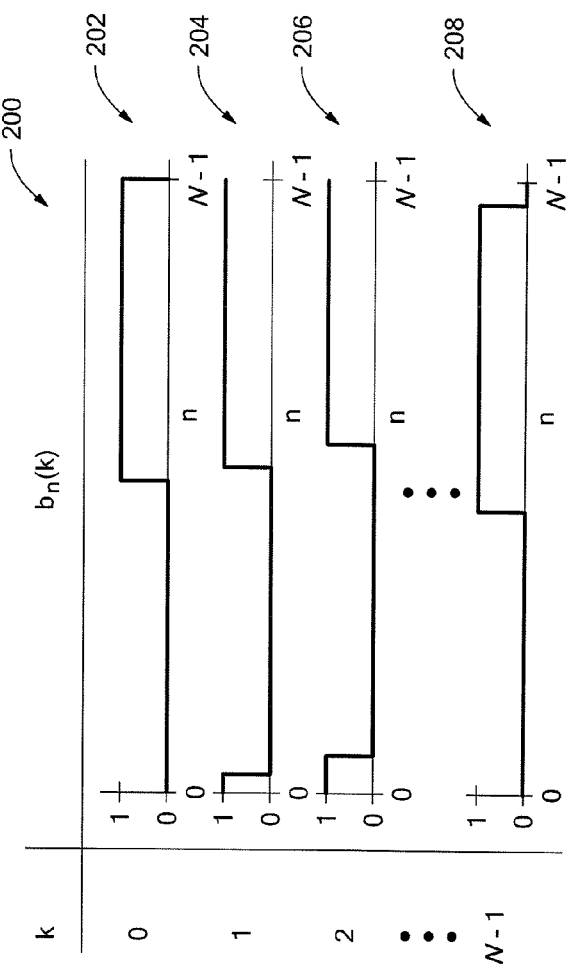
FIG. 6A is a series of graphs showing behavior of $b_n$ control signals generated by the $b_n$ control signal generator of FIG. 6.

Referring now to FIG. 6A, a chart 200 includes graphs 202-208, each graph showing the $b_n$ control signals, $b_0(k)$ to $b_{N-1}(k)$. Each cycle of the clock signal 186 of FIG. 6 provides a new set of $b_n$ control signals, $b_0(k)$ to $b_{N-1}(k)$, i.e., a new index value for the index, k.

Graphs 202-208 are very much like graphs shown and described above in conjunction with FIG. 5, and thus, the graphs 202-208 are not discussed further.

Figure 7:
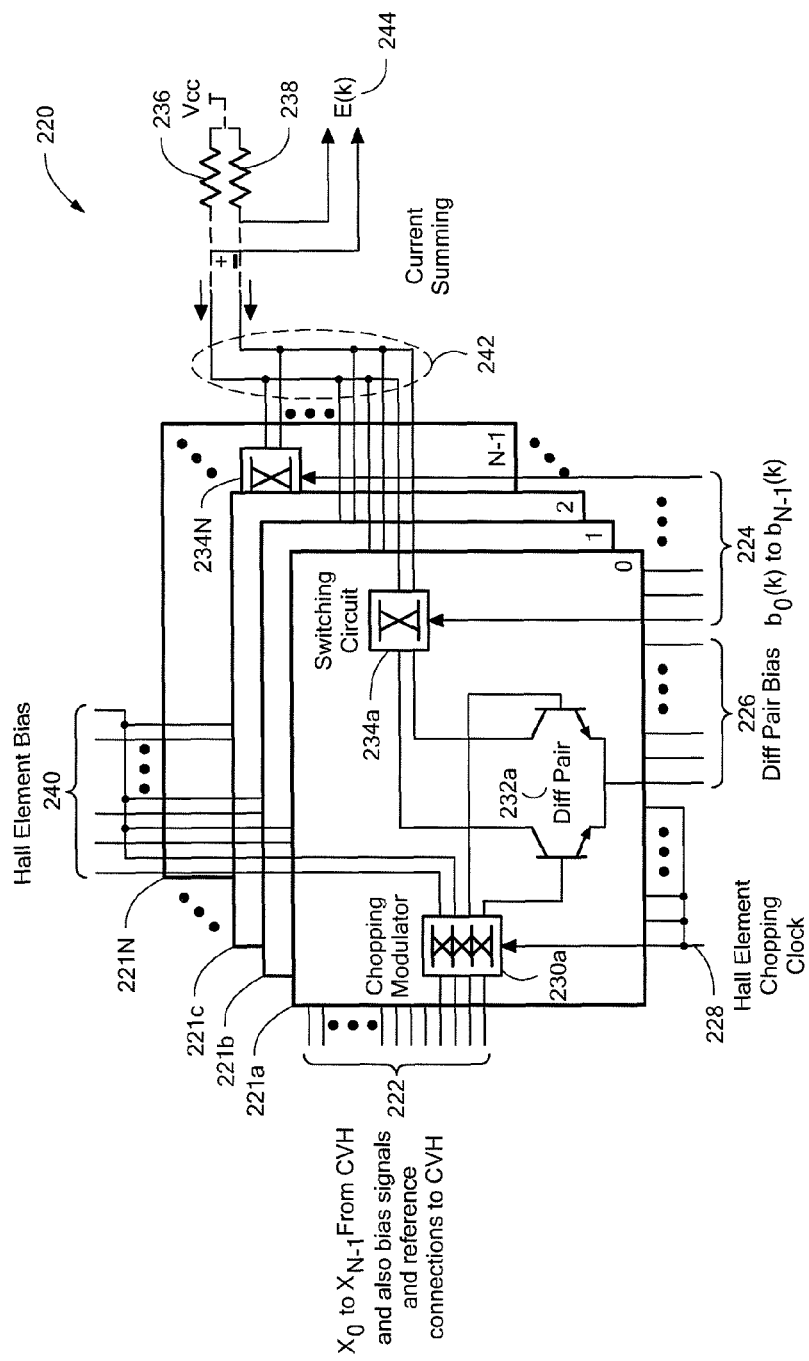
FIG. 7 is a block diagram showing at least an exemplary combining circuit that can be used as the combining circuit of FIG. 3.

Referring now to FIG. 7, an exemplary circuit 220 can include circuit portions 221a-221N, which is a circuit portion replicated N times, where N is the number of vertical Hall element positions, for example thirty-two, in a CVH sensing element.

The circuit 220 can include a combining circuit, which can include switching circuits 234a-234N and also a current summing circuit 242, which are coupled together. The combining circuit of FIG. 7 can be the same as or similar to the combining circuits 90, 130 of FIGS. 3 and 4, respectively. The combining circuit of FIG. 7 can generate a combined output signal 244, E(k), shown here as a differential signal. The combined output signal 244 can be the same as or similar to the combined output signal 90a of FIG. 3 and the combined output signal 134a of FIG. 4.

The circuit 220 can also include chopping modulators 230a-230N (230b-230N not shown), which are coupled to receive the CVH output signals 222, $x_0$ to $x_{N-1}$, which can be the same as or similar to the CVH output signals $x_0$ to $x_{N-1}$ of FIGS. 3 and 4. The chopping modulators 230a-230N are also coupled to provide bias signals 222 (e.g., current signals) and reference voltage connections 222 to the CVH sensing element. Bias signals and reference connections are described more fully below in conjunction with FIG. 10.

As described above, chopping uses a group of Hall element contacts, for example, five contacts, here within a CVH sensing element, and switches in various ways between the elements of the group. Thereafter, the chopping moves to a next element position, i.e., indexes around the CVH sensing element by an index step, for example, by one vertical Hall element contact within the CVH sensing element, where chopping is again performed on a next vertical Hall element.

As described above, in some embodiments, the chopping is not performed and the chopping modulators 230a-230N are not used.

Differential pairs 232a-232N (232b-232N not shown) are coupled to receive output signals from the chopping modulators 230a-230N, respectively. The differential pairs 232a-232N can generate current signals that are received by the switching circuits 234a-234N, respectively. Conversion from voltage signals to current signals allows for simple summation of signals 242 from the plurality of switching circuits 234a-234N to generate the combined output signal 244.

The switching circuits 234a-234N are coupled to receive control signals 224, $b_0(k)$ to $b_{N-1}(k)$, respectively, as described above in conjunction with FIG. 4. It will be understood from discussion above that the switching circuits 234a-234N are configured to either invert or to not invert current signals provided by the differential pairs 232a-232N, depending upon states of the control signals 224.

The chopping modulators 230a-230N are coupled to receive a Hall element chopping clock 228, which can be the same clock for each one of the chopping modulators 230a-230N, either sequentially or in parallel.

The chopping modulators 230a-230N can also be coupled to receive two or more Hall element bias signals 240 used in the chopping process. The Hall element bias signals can be the same for each one of the chopping modulators 230a-230N, either sequentially or in parallel.

The differential pairs 232a-232N can be coupled to receive differential pair bias signals 226. The differential pair bias signals 226 can be the same for each one of the differential pairs 232a-232N, either sequentially or in parallel.

Figure 8:
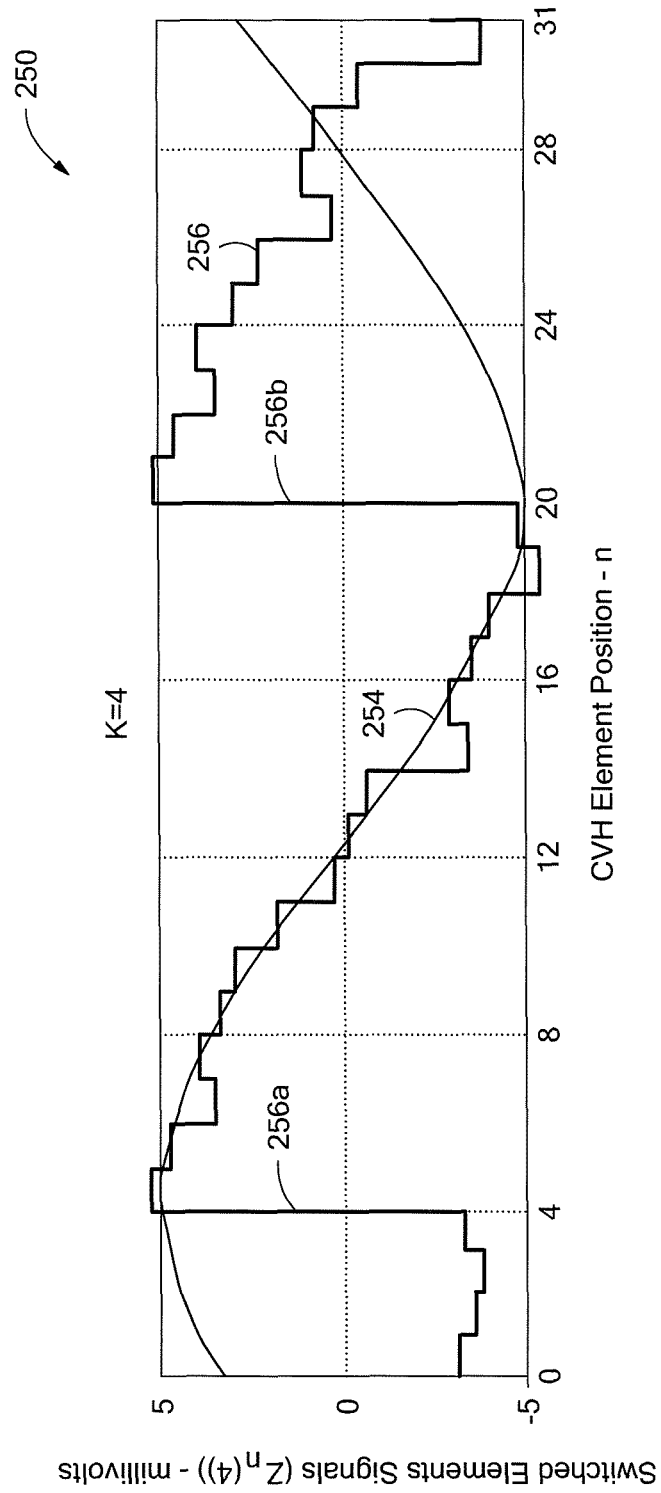
FIG. 8 is a graph showing an exemplary output signal from the switching circuits of FIG. 4 for particular $b_n$ control signals.

Referring now to FIG. 8, a graph 250 includes a horizontal axis with a scale in units of CVH element position, n. The graph 250 also includes a vertical axis with units of magnitude in millivolts. The vertical scale is representative of magnitude of switched element signals $z_0(k)$ to $z_{N-1}(k)$ (see, e.g., FIG. 4) for a k index value of four. While shown in voltage units in millivolts, the magnitude can either be in units of voltage or in units of current, depending upon the type of circuits used. The k index value of four is representative of a particular shift of the $b_n$ control signals (see, e.g., FIG. 5).

For reference only, a sine wave 254 is shown, which is like the sine wave 54 of FIG. 2.

A signal 256 is representative of the switched element signals (e.g., $z_0(4)$ to $z_{N-1}(4)$) from each one of thirty-two vertical Hall element positions within the CVH sensing element, before the signals are combined, for example, by the summing circuit 134 of FIG. 4. Comparing the signal 254 to the signal 52 of FIG. 2, it will be understood that from CVH element position 4 to CVH element position 19, the signal 256 is identical to the signal 52, while from CVH element positions 20 to 31 and positions 0 to 3, the signal 256 is inverted from the signal 52. Transitions 256a and 256b are apparent.

It will be apparent that if all of the magnitudes (steps) of the signal 256 were summed, e.g., by the summing circuit 134 of FIG. 4, the sum would be near zero.

Figure 8A:
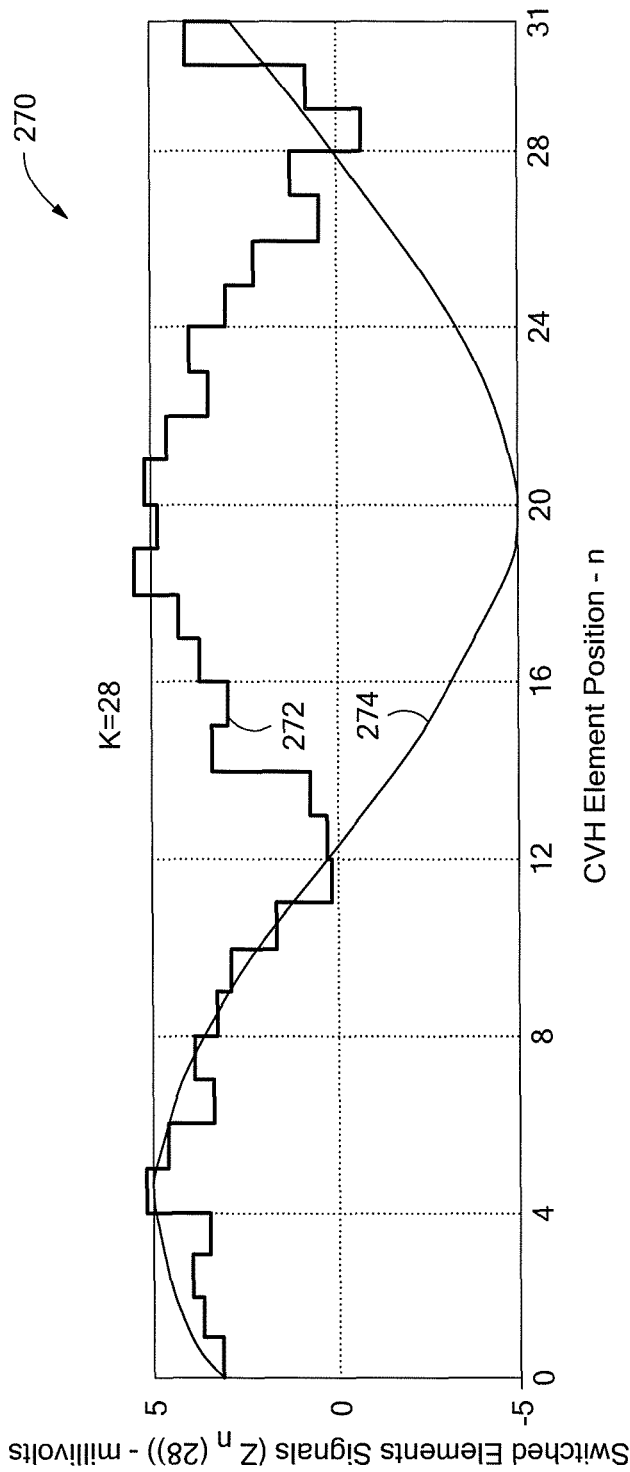
FIG. 8A is a graph showing another exemplary output signal from the switching circuits of FIG. 4 for different $b_n$ control signals.

Referring now to FIG. 8A, a graph 270 includes a horizontal axis with a scale in units of CVH element position, n. The graph 270 also includes a vertical axis with units of magnitude in millivolts. The vertical scale is representative of magnitude of switched element signals $z_0(k)$ to $z_{N-1}(k)$ (see, e.g., FIG. 4) for a k index value of twenty-eight. The k index value of twenty-eight is representative of another particular shift of the $b_n$ control signals (see, e.g., FIG. 5).

For reference only, a sine wave 274 is shown, which is like the sine wave 54 of FIG. 2.

A signal 272 is representative of the switched element signals (e.g., $z_0(28)$ to $z_{N-1}(28)$) from each one of thirty-two vertical Hall element positions within the CVH sensing element, before the signals are combined, for example, by the summing circuit 134 of FIG. 4. Comparing the signal 272 to the signal 52 of FIG. 2, it will be understood that from CVH element position 28 to CVH element position 31 and from positions 0 to 11, the signal 272 is identical to the signal 52, while from element positions 12 to 27, the signal 256 is inverted from the signal 52.

It will be apparent that if all of the magnitudes (steps) of the signal 272 were summed, e.g., by the summing circuit 134 of FIG. 4, the sum would be near to a maximum.

Figure 9:
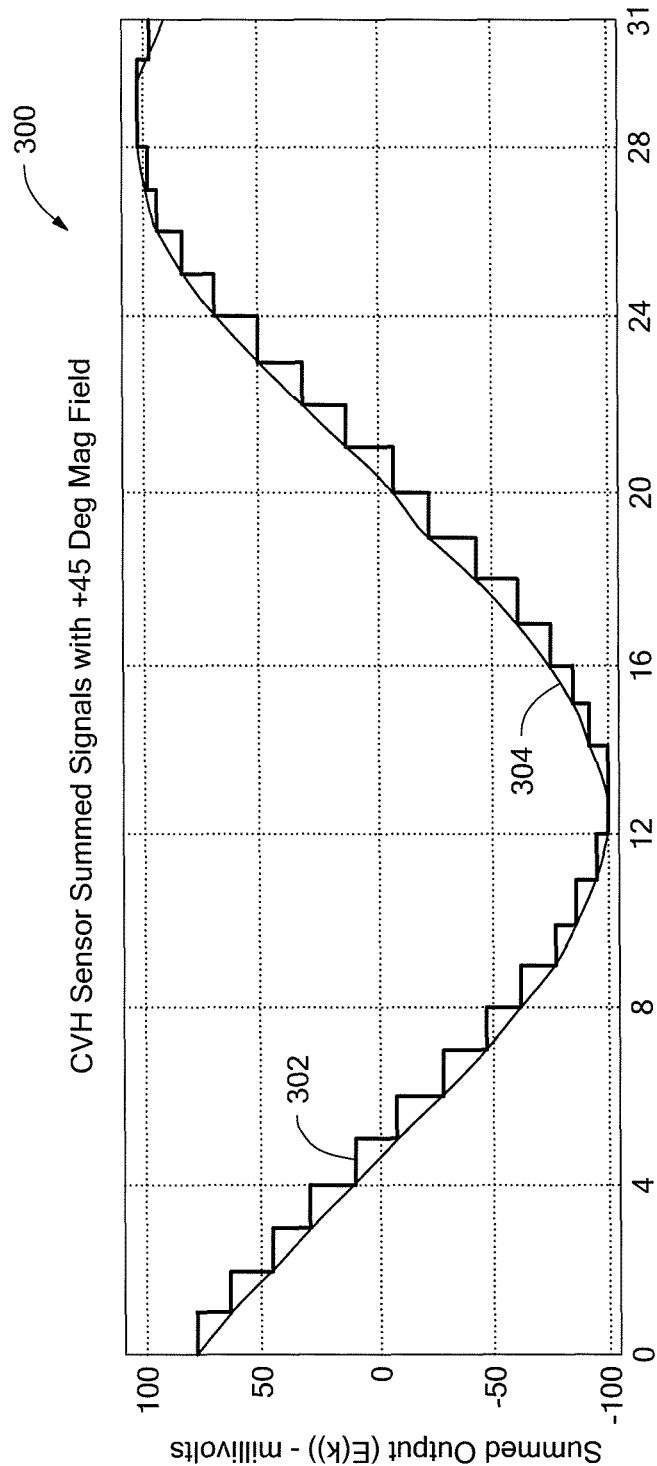
FIG. 9 is a graph showing an exemplary output signal from the combining circuit of FIG. 3.

Referring now to FIG. 9, a graph 300 includes a horizontal axis in units of the index value k. The graph 300 also includes a vertical scale in units of voltage in millivolts. A signal 302 is representative of a summed signal, for example, the summed signal 90a of FIG. 3 or the summed signal 134a of FIG. 4, for all N possible shifts of the b(n) control signals.

For reference only, a sine wave 304 is shown.

Comparing the signal 302 with the signals 256, 272 of FIGS. 8 and 8A, it can be seen that the signal 302 is near zero when the index value, k, is equal to four, and the signal 302 is near to a maximum when the index value, k, is equal to twenty-eight.

It will be noted that the offset errors in the signals 52, 256, 276 of FIGS. 3, 8, and 8A, which cause voltage deviations from the ideal sine wave from element position to element position, are greatly reduced in the signal 302 of FIG. 9. This is due to the summing provided by the summing circuit 134 of FIG. 4, which tends to average any random offset signals.

Referring briefly to FIG. 2, as described above, the pointing direction of the magnetic field 16 of FIG. 1, forty-five degrees, can be determined according to a maximum of the signal 52 at the CVH element position of four.

Referring again to FIG. 9, the pointing direction of the magnetic field 16 of FIG. 1 can instead be determined according to a zero crossing of the signal 302 at the index value, k, of four. Note that there are two zero crossings, one near k=4 and one near k=20. The zero crossing with the negative slope, from positive E(k) to negative E(k), will correspond to the pointing direction of the magnetic field. However, the signal 302 has less random fluctuation than the signal 52, and thus, the angle measurement should be more accurate.

The magnitude of the signal 302 is shown to be larger than the magnitude of the signal 52 of FIG. 2. The larger magnitude of the signal 302 is expected due to the summation of signals by the summing circuits, for example, by the summing circuit 134 of FIG. 4. The signal 302 can be represented as:

$$E(\theta_{IN}, k) = \frac{2GN}{\pi}\cos\left[\theta_{IN} + \frac{2\pi}{N}\left(k - \frac{1}{2}\right)\right]$$

where:
$\theta_{IN}$=magnetic field angle in plane of CVH sensing element;
k=$b_n$ control signal index;
N=total number of vertical Hall element positions used in the CVH sensing element; and
G=a constant related to maximum CVH sensor signal output, e.g., an amplitude of the sine wave signal 54 (FIG. 2) or an approximate amplitude of the signal 52 (FIG. 2), for example:

$$G = BSg_mR_{out}$$

where:
B=magnetic field magnitude (Gauss);
S=vertical Hall element sensitivity (volts/Gauss);
$g_m$=transconductance of differential pair 232a of FIG. 5;
Rout=transresistance of an output amplifier (volts/amps) (e.g., 236 of FIG. 7)
Thus, the magnitude of the result at any angle is:

$$2GN/\pi,$$

which is directly proportional the number of sensing elements in the summation. Using the signal of FIG. 2, which has a zero-to-peak amplitude of 5 mV, 2 GN/pi becomes 2*(5 mV)*32/pi=102 mV, which is consistent with the amplitude of the signal 302 (or 304) of FIG. 9.

It will be appreciated that the higher amplitude of the signal 304 results in an improved signal to noise ratio.

It will be appreciated from the above equation that when $\theta_{IN}$=45° or π/4, k=4.5 gives E($\theta_{IN}$,k)=0, thus the exact location for the zero crossing of E($\theta_{IN}$,k) will be between positions 4 and 5. It will also be appreciated from the above equation that when $\theta_{IN}$=45° or π/4, k=28.5 gives E($\theta_{IN}$,k)=2 GN/π, or the maximum of E($\theta_{IN}$,k), thus the exact location for the maximum of E($\theta_{IN}$,k) will be between positions 28 and 29. Also note that any angle can be determined from the value of k that results in the first zero crossing of E($\theta_{IN}$,k), which is when the argument of the cosine function is π/2 or 90°. This is determined from the equation:

$$\theta_{IN} = +\frac{\pi}{2} - \frac{2\pi}{N}\left(k - \frac{1}{2}\right)$$

As described in FIG. 3, the signal 302 (the signal 90a of FIG. 3) can be subsequently processed by the x-y direction component circuit 94 to identify a phase of the signal 90a, which is representative of the angle of the magnetic field. The signal 104a of FIG. 3 provides the phase representative of magnetic input angle.

While the circuits and methods described herein are shown by example of vertical Hall elements within a CVH sensing element, as described above, it should be appreciated that the same techniques can be used to process signals from a plurality of any type of sensing element. In some embodiments, the circuits and methods can be used to identify a largest signal from among the plurality of sensing elements. The same benefits of reduced offset signal variations and increased amplitude and processing speed will apply to any type of sensing elements, and not only to magnetic field sensing elements. For example, the same techniques could be applied to a plurality of acoustic sensing elements used to sense an acoustic signal. Depending upon the type of sensing elements, the x-y direction component circuit 94 of FIG. 3 may or may not be applicable. Other types of processing of the summed signal 90a of FIG. 3 may or may not be provided.

It should also be apparent that the same benefits can be achieved in relation to any type of sensor assemblies, i.e., to any type of sensors. For example, the same techniques could be applied to a plurality of magnetic field sensors, each having a magnetic field sensing element and associated processing circuitry, wherein the processing described herein can be applied to output signals from the magnetic field sensors downstream from the magnetic field sensing elements, e.g., to output signals from the magnetic field sensors.

As described above in conjunction with FIG. 4, the CVH sensing element described herein can be used either in a mode that provides sequential output signals from a plurality of vertical Hall elements or in a mode that can provide simultaneous and continuous output signals from a plurality of vertical Hall elements. A sequential arrangement is described in PCT Patent Application No. PCT/EP2008056517, which is incorporated by reference above. A continuous arrangement is described more fully below in conjunction with FIG. 10.

Figure 10:
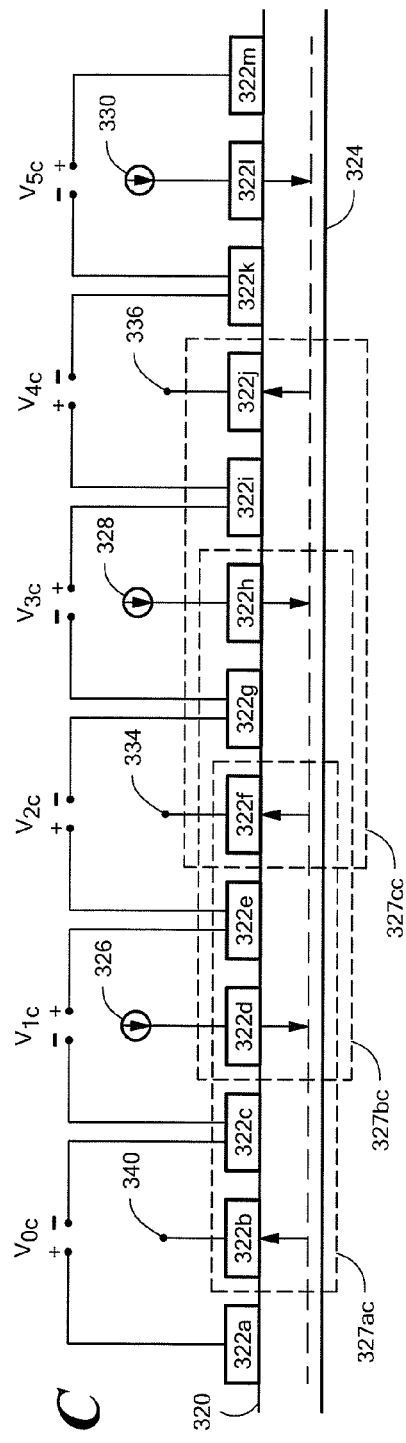
FIG. 10 is a block diagram showing a side view of a part of a CVH sensing element, which can be used to provide continuous output signals from a plurality of vertical Hall elements, either with or without chopping.
Figure 10:
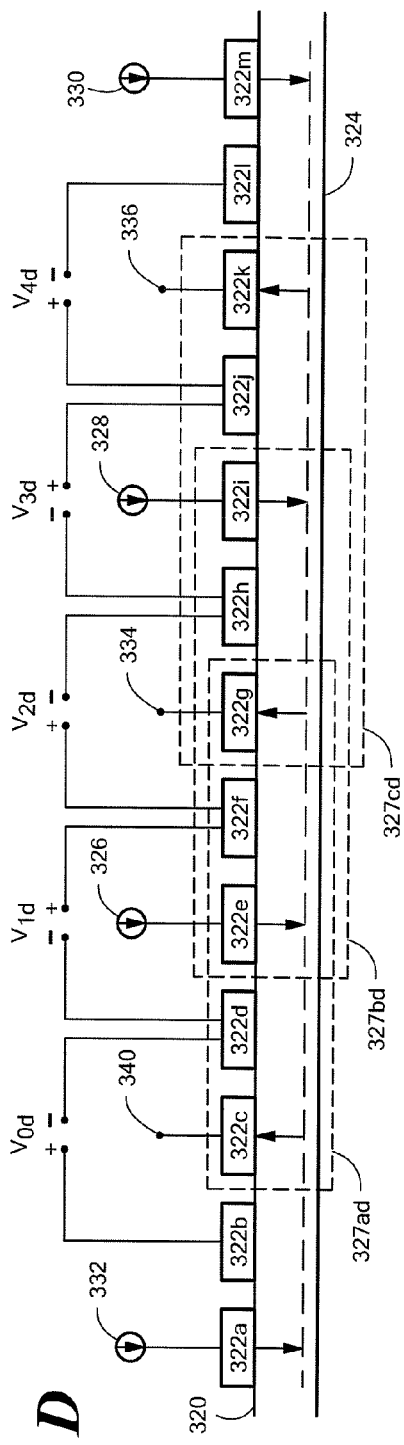

Referring now to FIG. 10, a portion of a CVH sensing element 320 is shown in panels A-D in four side views having a respective four different exemplary drive and signal arrangements. The drive and signal arrangements can be switched, for example, by the switching circuit 76 of FIG. 3., so that the arrangements of panels A-D are achieved sequentially in the above-described chopping of vertical Hall elements. However, if there is no chopping, the arrangement of any one of the panels A-D can be retained continuously.

The panels A-D have the same reference designations to indicate the same elements. The CVH sensing element 320 includes a plurality of vertical Hall element contacts, of which vertical Hall element contacts 322a-322m are but some of the vertical Hall element contacts in the CVH sensing element 320. The vertical Hall element contacts 322a-322m are arranged over a section of a common circular implant region 324 in a substrate (not shown), which can be the same as or similar to the common circular implant region 18 of FIG. 1. The vertical Hall element contacts 322a-322m can be the same as or similar to the vertical Hall element contacts (i.e., 12aa) of FIG. 1.

Vertical hall elements 322a-322m are arranged with groups of five vertical Hall element contacts, each group representing a vertical Hall element. For example, referring to panel A of FIG. 10, a first vertical Hall element 327aa includes the vertical Hall element contacts 322b-322f. A second vertical Hall element 327ab includes the vertical Hall element contacts 322d-322h. A third vertical 327ac includes the vertical Hall element contacts 322f-322j.

Still referring to panel A of FIG. 10, for the first vertical Hall element 327aa, current sources 326, 328 drive currents into the vertical Hall element contacts 322b, 322f. A reference coupling 334 is used to couple the vertical Hall element contact 322d to a reference voltage, for example, a ground voltage. Current from the current source 326 passes through the vertical Hall element contact 322b and splits in two, with approximately half of the current flowing toward the reference coupling 334 and approximately half of the current flowing toward another reference coupling (not shown) connected to a vertical Hall element contact positioned to the left of vertical Hall element contact 322b. Similarly, the current from the current source 328 passes through vertical Hall element contact 322f and splits in two, with approximately half of the current flowing toward the reference coupling 334 and approximately half of the current flowing toward the reference coupling 336. Thus, for the first vertical Hall element 327aa, currents flow from the vertical Hall element contacts 322b, 322f to the vertical Hall element contact 322d as indicated by arrows and dashed lines.

Still referring to the first vertical Hall element 327aa in panel A of FIG. 10, if a positive magnetic field is present in a direction perpendicular to the first vertical Hall element 327aa and facing into the page, the upward-flowing current under vertical Hall element contact 322d creates a positive voltage when measured from vertical Hall element contact 322c to vertical Hall element contact 322e, according to the Hall effect. Therefore an output voltage, $V_{1a}$, of the first vertical Hall element 327aa is oriented so that the positive terminal is on the left, connected to the vertical Hall element contact 322c, and the negative terminal is on the right, connected to the vertical Hall element contact 322e.

For the second vertical Hall element 327ba, the current source 328 drives a current into the vertical Hall element contact 322f. Reference couplings 334, 336 are used to couple the vertical Hall element contacts 322d, 322h to a reference voltage, for example, a ground voltage. As described above, the current from the current source 328 passes through vertical Hall element contact 322f and splits in two, with approximately half of the current flowing toward reference coupling 336 and approximately half of the current flowing toward reference coupling 334. Thus, the current source 328 and the reference coupling 334 are continuously shared between the first and second vertical Hall elements 327aa, 327ba, respectively. For the second vertical Hall element 327ba, currents flow from the vertical Hall element contact 322f to the vertical Hall element contacts 322d, 322h as indicated by arrows and dashed lines.

Still referring to the second vertical Hall element 327ba in panel A of FIG. 10, if a positive magnetic field is present in a direction perpendicular to the second vertical Hall element 327ba and facing into the page, the downward-flowing current under vertical Hall element contact 322f creates a positive voltage when measured from the vertical Hall element contact 322g to the vertical Hall element contact 322e, according to the Hall effect. Therefore an output voltage, $V_{2a}$, of the second vertical Hall element 327ba is oriented so that the positive terminal is on the right, connected to the vertical Hall element contact 322g, and the negative terminal is on the left, connected to the vertical Hall element contact 322e. Note also that the negative terminal connection connected to the vertical Hall element contact 322e is continuously shared between the first and second vertical Hall elements 327aa, 327ba, respectively.

For the third vertical Hall element 327ca, current sources 328, 330 drive currents into the vertical Hall element contacts 322f, 322j. A reference coupling 336 is used to couple the vertical Hall element contact 322h to a reference voltage, for example, a ground voltage. Thus, currents flow from the vertical Hall element contacts 322f, 322j to the vertical Hall element contact 322h as indicated by arrows and dashed lines. As described above, the current from the current source 328 passes through the vertical Hall element contact 322f and splits in two, with approximately half of the current flowing toward the reference coupling 334 and approximately half of the current flowing toward the reference coupling 336. Similarly, the current from the current source 330 passes through vertical Hall element contact 322j and splits in two, with approximately half of the current flowing toward the reference coupling 336 and approximately half of the current flowing toward the reference coupling 338. Thus, for the third vertical Hall element 327ca, currents flow from the vertical Hall element contacts 322f, 322j to the vertical Hall element contact 322h as indicated by arrows and dashed lines.

Still referring to the third vertical Hall element 327ca in panel A of FIG. 10, if a positive magnetic field is present in a direction perpendicular to the third vertical Hall element 327ca and facing into the page, the upward-flowing current under vertical Hall element contact 322h creates a positive voltage when measured from the vertical Hall element contact 322g to the vertical Hall element contact 322i, according to the Hall effect. Therefore an output voltage, $V_{3a}$, of the third vertical Hall element 327ca is oriented so that the positive terminal is on the left, connected to vertical Hall element contact 322g, and the negative terminal is on the right, connected to vertical Hall element contact 322i.

Other vertical Hall elements in the CVH sensing element 320 are similarly coupled. Although not depicted in panel A of FIG. 10, all vertical Hall element contacts in panel A are circularly arranged over a common circular implant region so that additional vertical Hall element contacts to the right of vertical Hall element contact 322m will adjoin next to additional vertical Hall element contacts to the left of vertical Hall element contact 322a. With this arrangement, adjacent couplings are identical for all elements, including elements that define starting and ending points around the circular CVH structure.

It will be understood that the arrangement of panel A can be maintained continuously, in which case, the number of vertical Hall elements is equal to half of the total number of vertical Hall element contacts. For example, if there are sixty-four vertical Hall element contacts in the CVH sensing element 320, then there are thirty-two vertical Hall elements, each providing a continuous output signal.

If the arrangement of panel A is maintained, then a plurality of output signals from the CVH sensing element 320 are continuous signals, in which case, the sample and hold circuits 138 of FIG. 4 are not needed and continuous signals (i.e., $x_0-x_{N-1}$) can be presented to the switching circuits 136a-136N of FIG. 4. The same is true if any of the arrangements of panels B-D are continuously maintained.

While panel A is representative of vertical Hall elements using all of the vertical Hall element contacts in the CVH sensing element, in some embodiments, only two or more vertical Hall elements provide output signals at the same time, wherein the two vertical Hall elements can either share vertical Hall element contacts or not. Each vertical Hall element can generate a differential output signal.

It should be understood that the current sources 326, 328, 330 and the reference couplings 334, 328, 330 represent particular drive signal generators to drive the vertical Hall elements 327ab, 327bb, 327cb in order to generate output signals. However, it should be recognized that there are other drive arrangements, for example, using voltage sources.

Panels B-D are representative of a chopping arrangement in which all output signals are still available, but for which each output signal (i.e., each vertical Hall element) is chopped to provide four output signal versions. Current directions in relation to output voltage polarities in panels B-D will be understood from discussion above in conjunction with panel A.

Referring now to panel B, the current sources 326, 328, 330 are shifted to the right by one vertical Hall element contact. The reference couplings 334, 336, 338 are also shifted to the right by one and an additional reference coupling 340 is shown coupled to the vertical Hall element contact 322a.

In panel B, the first, second, and third vertical Hall elements 327ab, 327bb, 327cb are shifted to the right from their previous positions by one vertical Hall element contact. An output voltage signals $V_{1b}$) from the first vertical Hall element 327*ab* results between the vertical Hall element contacts 322*d*, 322*f*. An output voltage signals $V_{2b}$ from the second vertical Hall element 327*bb* results between the vertical Hall element contacts 322*f*, 322*h*. An output voltage signals $V_{3b}$ from the third vertical Hall element 327*cb* results between the vertical Hall element contacts 322*h*, 322*j*.

Referring now to panel C, the current sources 326, 328, 330 are again shifted to the right by one vertical Hall element contact. The reference couplings 334, 336, 338, 340 are also shifted to the right by one.

In panel C, the first, second, and third vertical Hall elements 327*ac*, 327*bc*, 327*cc* are shifted to the left from their previous positions by one vertical Hall element contact. An output voltage signals $V_{1c}$ from the first vertical Hall element 327*ac* results between the vertical Hall element contacts 322*c*, 322*e*. An output voltage signals $V_{2c}$ from the second vertical Hall element 327*bc* results between the vertical Hall element contacts 322*e*, 322*g*. An output voltage signals $V_{3c}$ from the third vertical Hall element 327*cc* results between the vertical Hall element contacts 322*g*, 322*i*.

Referring now to panel D, the current sources 326, 328, 330 are again shifted to the right by one vertical Hall element contact. The reference couplings 334, 336, 338, 340 are also shifted to the right by one. An additional current source 332 is shown coupled to the vertical Hall element contact 322*a*.

In panel D, the first, second, and third vertical Hall elements 327*ad*, 327*bd*, 327*cd* are shifted to the right from their previous positions by one vertical Hall element contact. An output voltage signals $V_{1d}$ from the first vertical Hall element 327*ad* results between the vertical Hall element contacts 322*d*, 322*f*. An output voltage signals $V_{2d}$ from the second vertical Hall element 327*bd* results between the vertical Hall element contacts 322*f*, 322*h*. An output voltage signals $V_{3d}$ from the third vertical Hall element 327*cd* results between the vertical Hall element contacts 322*h*, 322*j*.

While the first, second, and third vertical Hall elements are shown to shift right and left in the panels A-D, for the purposes of chopping, they can still considered to be the same vertical Hall element. It will be recognized that by shifting right and left, in the presence of a static magnetic field, the vertical Hall elements will output slightly different signal magnitudes and phases upon each shift. However, unlike the offset voltages represented by the irregular steps of the signal 52 of FIG. 2, the magnitude and phase shifts caused by the shifting positions are deterministic and can be removed by subsequent processing if desired.

For chopping, taking the first vertical Hall element 327*aa*, 327*ab*, 327*ac*, 327*ad* as an example, with the four possible couplings of the drive and reference contacts (current in, current out, positive voltage measurement, negative voltage measurement), any offset voltages associated with the first vertical Hall element, when combined using an average of the output voltage signals $V_{1a}$, $V_{1b}$, $V_{1c}$, $V_{1d}$, will nearly cancel. Thus, chopping can achieve a reduction in the offset voltages otherwise represented in the signal 52 of FIG. 2.

It will also be recognized that the combining circuit 90 of FIG. 3 combines a plurality of signals from a plurality of vertical Hall elements. Thus, the combining circuit 90 also tends to reduce the effect of offset voltages, resulting in a signal 302 (FIG. 9) having regular rather than random steps.

Therefore, in some embodiments of the circuit 70 of FIG. 3 no chopping is used and in other embodiments, chopping is used. Also, in some embodiments, only a subset of the arrangements of panels A-D are used, for example, only the arrangements of panel A and panel B are used.

In some embodiments the chopping, i.e., the switching between the arrangements of panels A-D occurs with a chopping rate in the range of about 100 kHz to about 10 MHz.

While the vertical Hall elements of FIG. 10 are represented as groups of five vertical Hall element contacts, in some embodiments, there can be more than five vertical Hall element contacts in each vertical Hall element. In still other embodiments, there can be three or four vertical Hall element contacts in each vertical Hall element.

While the continuously driven vertical Hall elements are shown to overlap by three vertical Hall element contacts (i.e., they share three vertical Hall element contacts), in other embodiments, the continuously driven vertical Hall elements can overlap by one vertical Hall element contact. (see, e.g., vertical Hall elements 327*aa*, 327*ca*).

In still other embodiment, circumferential centers (in a direction around the circle of the CVH sensing element) of two continuously driven vertical Hall elements are angularly disposed around the CVH sensing elements by less than one hundred eighty degrees. Thus, in these embodiments, the two vertical Hall elements generate output signals that are not representative of opposite magnetic field directions relative to each other.

In some embodiments, circumferential centers of the continuously driven vertical Hall elements are angularly disposed around the CVH sensing elements by an angle less than or equal to about forty-five degrees.

It should be understood that a configuration, such as that of FIG. 10, for which the plurality of output signals are generated continuously rather than sequentially by the CVH sensing element, will tend to result in a faster angle sensor that is more quickly responsive to any change in a direction of a magnetic field.

It will also be understood that, where chopping is used, a faster chopping (e.g., between the arrangements of panels A-D) will tend to result in a faster angle sensor that is more quickly responsive to any change in a direction of a magnetic field. An even faster angle sensor may be achieved with no chopping, in which case the combining circuit 90 of FIG. 4 can provide, among other benefits, the reduction of offset voltages.

While an example of a CVH sensing element used in a way to provide continuous output signals is shown above, as described further above, in other embodiments, the CVH sensing element can instead be used in a way to provide sequential output signals. For those embodiments, the sequencing and chopping is more straightforward. For example, a first vertical Hall element can first be selected having, for example, five vertical Hall element contacts, and can provide an output signal. If chopping is desired, the configuration of the bias signal, reference coupling, and output signals of the first selected vertical Hall element can be reconfigured, for example, to provide multiple output signals that can be averaged. Thereafter, a next vertical Hall element can be selected, which can be offset from the first selected vertical Hall element, for example, by one vertical Hall element contact from the first selected vertical Hall element, and the chopping can be repeated. If no chopping is used, a particular single configuration of bias, reference, and output signals from each selected vertical Hall element can be used.

While a CVH sensing element is used in examples of an angle sensor above, it should be understood that the same benefits can be achieved with another type of angle sensor, for example, a plurality of separate vertical Hall elements or a plurality of separate magnetoresistance elements.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A method of operating a circular vertical Hall (CVH) sensing element having a plurality of vertical Hall element contacts disposed in a circle over a common implant region in a substrate, the method comprising:
   selecting a plurality of groups of vertical Hall element contacts from among the plurality of vertical Hall element contacts, each group representative of a respective one of a plurality of vertical Hall elements, wherein the selecting comprises selecting a first group of vertical Hall element contacts representative of a first vertical Hall element, and selecting a second group of vertical Hall element contacts representative of a second vertical Hall element; and
   driving at the same time the first and the second vertical Hall elements to provide at the same time a first vertical Hall element output signal between two of the vertical Hall element contacts of the first group and a second vertical Hall element output signal between two of the vertical Hall element contacts of the second group, wherein, in response to a magnetic field having a direction along a magnetic field axis, the first and the second vertical Hall element output signals are not representative of opposite magnetic field directions of the magnetic field relative to each other.

2. The method of claim 1, wherein the selecting further comprises:
   selecting a third group of vertical Hall element contacts representative of a third vertical Hall element from among the plurality of vertical Hall element contacts, and wherein the driving further comprises:
   driving at the same time the third vertical Hall element to provide at the same time a third vertical Hall element output signal between two of the vertical Hall element contacts of the third group.

3. The method of claim 1, wherein the first and the second groups of vertical Hall element contacts share at least one vertical Hall element contact with each other.

4. The method of claim 1, wherein the first and the second groups of vertical Hall element contacts share at least three vertical Hall element contacts with each other.

5. The method of claim 1, wherein the circumferential centers of the first and the second vertical Hall elements are disposed at positions around the ring separated by less than one hundred eighty degrees.

6. The method of claim 1, wherein the plurality of groups of vertical Hall element contacts and associated vertical Hall elements comprise all of the plurality of vertical Hall element contacts in the circular vertical Hall sensing element used in a vertical Hall element, wherein the method further comprises:
   driving at the same time each one of the vertical Hall elements to provide at the same time vertical Hall element output signals between two respective vertical Hall element contacts of each one of the vertical Hail elements.

7. The method of claim 1, further comprising:
   at a chopping rate, changing the vertical Hall element contacts to which drive signal sources are coupled in each one of the represented vertical Hall elements; and
   separately summing or separately averaging the output signals from each one of the represented vertical Hall elements as the changing occurs.

8. A circular vertical Hall (CVH) sensing element circuit, comprising:
   a substrate;
   a common circular implant region in a surface of the substrate;
   a plurality of vertical Hall element contacts disposed in a circle over the common implant region and upon the surface, each group representative of a respective one of a plurality of vertical Hall elements, a first group representative of a first vertical Hall element, and a second group representative of a second vertical Hall element; and
   respective first and second drive signal generators disposed upon the substrate and configured to drive at the same time the first and the second vertical Hall elements to provide at the same time a first vertical Hall element output signal between two of the vertical Hall element contacts of the first group and a second vertical Hall element output signal between two of the vertical Hall element contacts of the second group, wherein, in response to a magnetic field having a direction along a magnetic field axis, the first and the second vertical Hall element output signals are not representative of opposite magnetic field directions of the magnetic field relative to each other.

9. The circular vertical Hall (CVH) sensing element circuit of claim 8, wherein a third group selected from the plurality of vertical Hall element contacts is representative of a third vertical Hall element, the circular vertical Hall (CVH) sensing element circuit further comprising
   a respective third drive signal generator disposed upon the substrate and configured to drive at the same time the third vertical Hall element to provide at the same time a third vertical Hall element output signal between two of the vertical Hall element contacts of the third group.

10. The circular vertical Hall (CVH) sensing element circuit of claim 8, wherein the first and the second groups of vertical Hall element contacts share at least one vertical Hall element contact with each other.

11. The circular vertical Hall (CVH) sensing element circuit of claim 8, wherein the first and the second groups of vertical Hall element contacts share at least three vertical Hall element contacts with each other.

12. The circular vertical Hall (CVH) sensing element circuit of claim 8, wherein the plurality of groups of vertical Hall element contacts and associated plurality of vertical Hall elements comprise all of the plurality of vertical Hall element contacts in the circular vertical Hall sensing element used in a vertical Hall element, wherein the circular vertical Hall (CVH) sensing element circuit further comprises:
   respective drive signal sources disposed upon the substrate and configured to drive at the same time each one of the vertical Hall elements to provide at the same time vertical Hall element output signals between two respective vertical Hall element contacts of each one of the vertical Hall elements.

* * * * *